(12) United States Patent
Uchizono et al.

(10) Patent No.: US 7,385,397 B2
(45) Date of Patent: Jun. 10, 2008

(54) MAGNETIC RESONANCE IMAGING DEVICE AND DATA PROCESSING METHOD FOR MAGNETIC RESONANCE IMAGING DEVICE

(75) Inventors: Shinichi Uchizono, Nasushiobara (JP); Yoshio Machida, Nasushiobara (JP); Nobuyasu Ichinose, Otawara (JP)

(73) Assignees: Kabushiki Kaisha Toshiba, Tokyo (JP); Toshiba Medical Systems Corp., Tochigi-ken (JP)

( * ) Notice: Subject to any disclaimer, the term of this patent is extended or adjusted under 35 U.S.C. 154(b) by 229 days.

(21) Appl. No.: 10/539,086

(22) PCT Filed: Feb. 25, 2005

(86) PCT No.: PCT/JP2005/003659

§ 371 (c)(1),
(2), (4) Date: Jun. 15, 2005

(87) PCT Pub. No.: WO2005/082245

PCT Pub. Date: Sep. 9, 2005

(65) Prior Publication Data

US 2006/0106299 A1    May 18, 2006

(30) Foreign Application Priority Data

Feb. 26, 2004  (JP) ............... 2004-052312
Feb. 26, 2004  (JP) ............... 2004-052313

(51) Int. Cl.
*G01V 3/00* (2006.01)

(52) U.S. Cl. ..................... 324/318; 324/309
(58) Field of Classification Search ........ 324/300–322; 382/128
See application file for complete search history.

(56) References Cited

U.S. PATENT DOCUMENTS

| | | | |
|---|---|---|---|
| 6,995,559 B2 * | 2/2006 | Agilandam et al. | 324/309 |
| 7,187,791 B2 * | 3/2007 | Ikezaki | 382/128 |
| 2003/0228043 A1 | 12/2003 | Ikezaki | |
| 2004/0000906 A1 | 1/2004 | King et al. | |

FOREIGN PATENT DOCUMENTS

| | | |
|---|---|---|
| JP | 3-224540 | 10/1991 |
| JP | 9-238920 | * 9/1997 |
| JP | 11-56811 | 3/1999 |
| JP | 2003-265432 | 9/2003 |

* cited by examiner

*Primary Examiner*—Brij B. Shrivastav
(74) *Attorney, Agent, or Firm*—Nixon & Vanderhye P.C.

(57) ABSTRACT

A magnetic resonance imaging apparatus 20 includes a scan executing unit that executes scan to generate sensitivity map data of an RF coil 24, a region reduction unit 44b that applies region reduction to a signal region near a no-signal region of image data obtained by the scan, a sensitivity map data generating unit 44 that generates sensitivity map data using image data after the region reduction, and a smoothing processing unit 44i that applies three-dimensional smoothing filter to the sensitivity map data.

13 Claims, 20 Drawing Sheets

FIG. 4

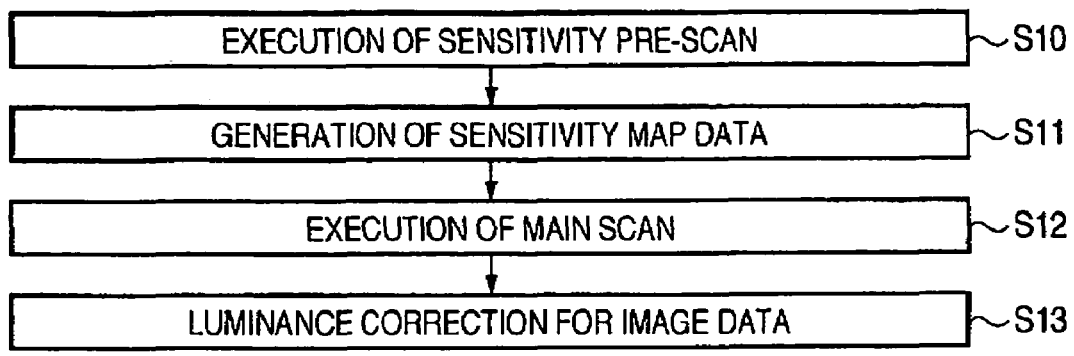

- EXECUTION OF SENSITIVITY PRE-SCAN — S10
- GENERATION OF SENSITIVITY MAP DATA — S11
- EXECUTION OF MAIN SCAN — S12
- LUMINANCE CORRECTION FOR IMAGE DATA — S13

FIG. 5

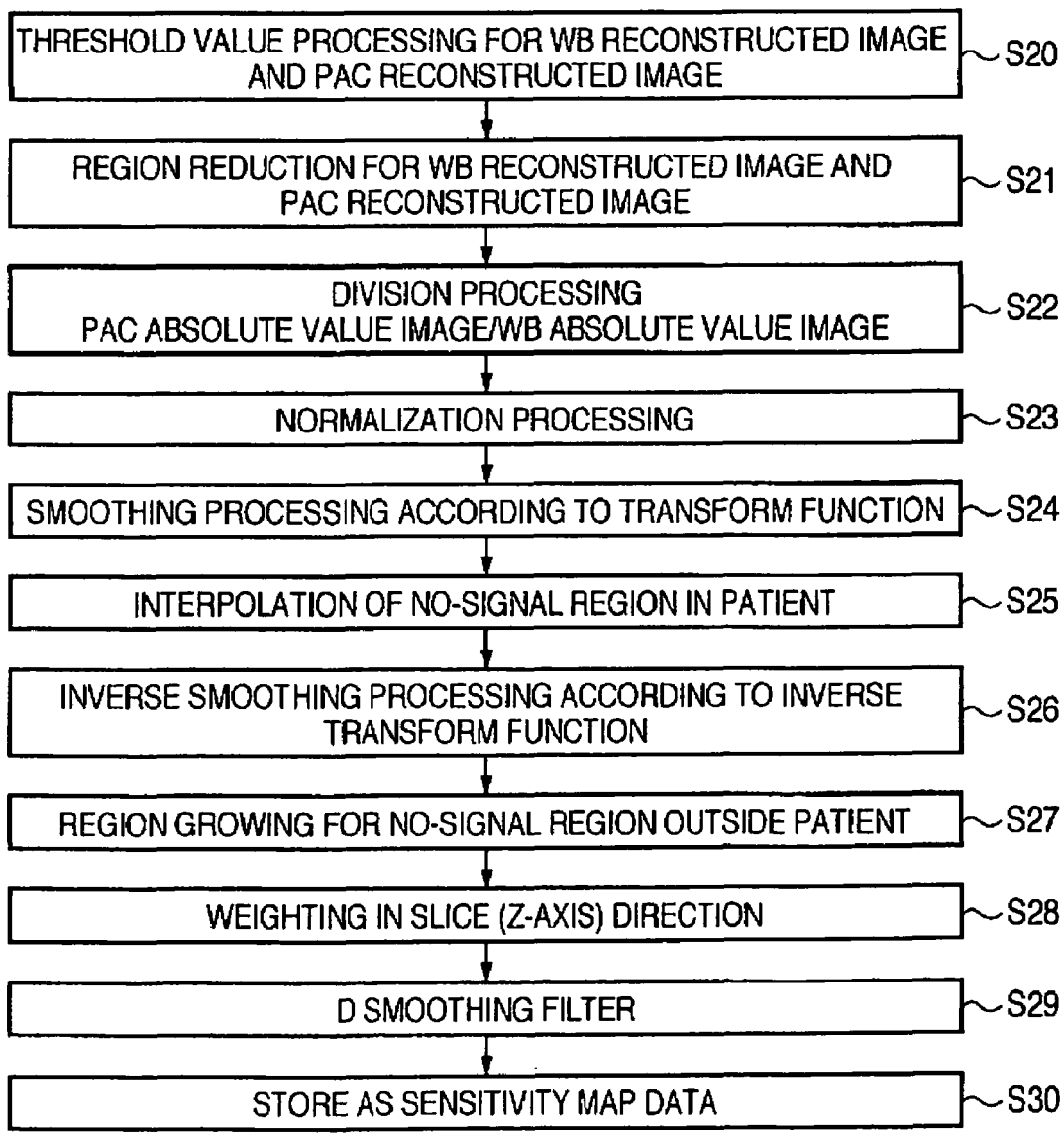

- THRESHOLD VALUE PROCESSING FOR WB RECONSTRUCTED IMAGE AND PAC RECONSTRUCTED IMAGE — S20
- REGION REDUCTION FOR WB RECONSTRUCTED IMAGE AND PAC RECONSTRUCTED IMAGE — S21
- DIVISION PROCESSING PAC ABSOLUTE VALUE IMAGE/WB ABSOLUTE VALUE IMAGE — S22
- NORMALIZATION PROCESSING — S23
- SMOOTHING PROCESSING ACCORDING TO TRANSFORM FUNCTION — S24
- INTERPOLATION OF NO-SIGNAL REGION IN PATIENT — S25
- INVERSE SMOOTHING PROCESSING ACCORDING TO INVERSE TRANSFORM FUNCTION — S26
- REGION GROWING FOR NO-SIGNAL REGION OUTSIDE PATIENT — S27
- WEIGHTING IN SLICE (Z-AXIS) DIRECTION — S28
- D SMOOTHING FILTER — S29
- STORE AS SENSITIVITY MAP DATA — S30

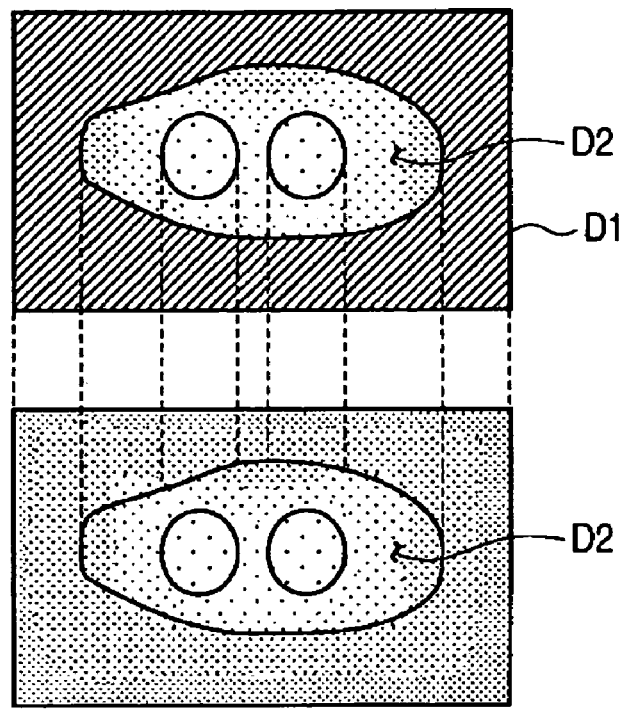
FIG. 10A
FIG. 10B
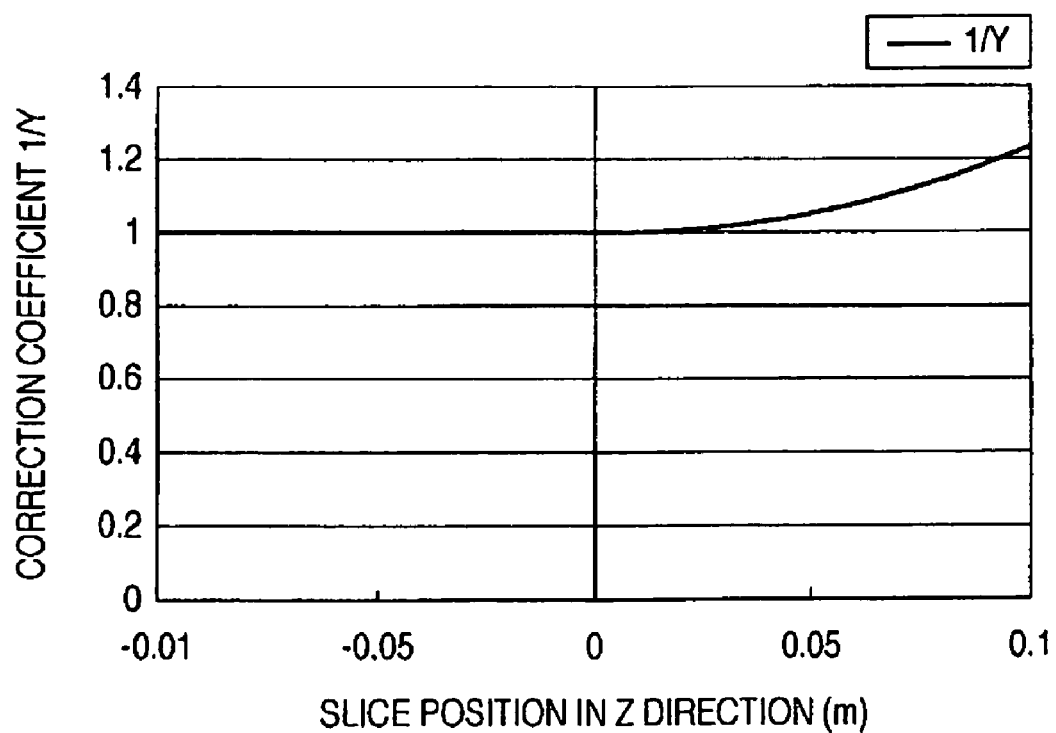
FIG. 11

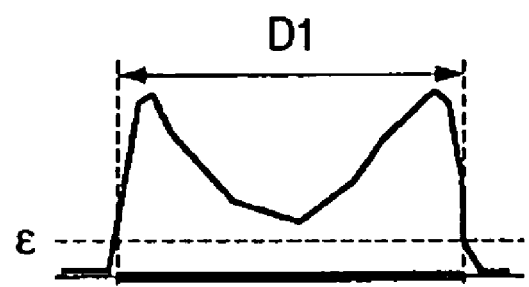
FIG. 20A
FIG. 20B
FIG. 20C
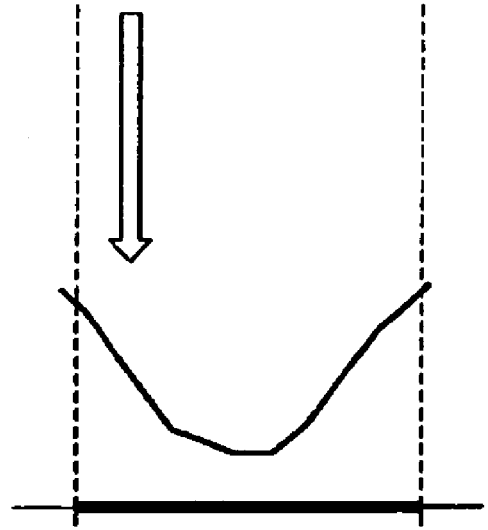
FIG. 20D
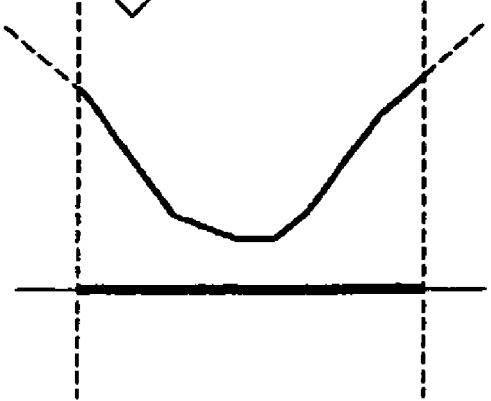

MAGNETIC RESONANCE IMAGING DEVICE AND DATA PROCESSING METHOD FOR MAGNETIC RESONANCE IMAGING DEVICE

This application is the US national phase of international application PCT/JP2005/003659, filed 25 Feb. 2005, which designated the U.S. and claims priority of JP 52312/2004, filed 26 Feb. 2004, and JP 52313/2004, filed 26 Feb. 2004, the entire contents of each of which are hereby incorporated by reference.

TECHNICAL FIELD

The present invention relates to a magnetic resonance imaging apparatus that images a patient using a nuclear magnetic resonance signal and a data processing method for the magnetic resonance imaging apparatus. In particular, the invention relates to a magnetic resonance imaging apparatus that corrects non-uniformity in luminance and signal values of image data due to a sensitivity distribution of a reception coil and a data processing method for the magnetic resonance imaging apparatus.

BACKGROUND ART

Conventionally, as a monitoring apparatus in medical spots, a magnetic resonance imaging (MRI) apparatus 1 shown in FIG. 24 has been used (see, for example, Japanese Patent No. 3135592).

The magnetic resonance imaging apparatus 1 is an apparatus that forms gradient magnetic fields in X-axis, Y-axis, and Z-axis directions in an imaging region of a patient P, who is set inside a cylindrical magnet for static magnetic field 2 forming a static magnetic field, using respective gradient magnetic field coils 3x, 3y, and 3z of a gradient magnetic field coil unit 3 and transmits a radiofrequency (RF) signal of the Larmor frequency from a radio frequency (RF) coil 4 to thereby cause a nuclear spin in the patient P to magnetically resonate and uses a nuclear magnetic resonance (NMR) signal caused by excitation to reconstruct an image of the patient.

A static magnetic field is formed inside the magnet for static magnetic field 2 by a static magnetic field power supply 5 in advance. A sequence controller control unit 7a gives a sequence, which is control information for a signal, to a sequence controller 8 according to a command from an input device 6. The sequence controller 8 controls a gradient magnetic field power supply 9, which is connected to the respective gradient magnetic field coils 3x, 3y, and 3z, and a transmitter 10, which gives a radiofrequency signal to the RF coil 4, in accordance with the sequence. Therefore, a gradient magnetic field is formed in the imaging region and the radiofrequency signal is transmitted to the patient P.

In this case, the X-axis gradient magnetic field, the Y-axis gradient magnetic field, and the Z-axis gradient magnetic field formed by the gradient magnetic field coils 3x, 3y, and 3z are mainly used as a phase encoding (PE) gradient magnetic field, a readout (RO) gradient magnetic field, and a slice encoding (SE) gradient magnetic field. Consequently, an X coordinate, a Y coordinate, and a Z coordinate, which are position information of an atomic nucleus, are transformed into a phase and a frequency of a nuclear spin and a position of a slice. The sequence is executed repeatedly while a phase encode amount is changed.

The NMR signal, which is generated according to the excitation of the nuclear spin in the patient P, is received by the RF coil 4 and given to a receiver 11 to be converted into digital raw data. The raw data is taken into the sequence controller control unit 7a via the sequence controller 8. The sequence controller control unit 7a arranges the raw data in a K space (a Fourier space) formed in a raw data database 7b. Then, an image reconstructing unit 7c executes the Fourier transformation on the raw data arranged in the K space, whereby reconstructed image data of the patient P is obtained and stored in the image data database 7d. Moreover, image data is given to a display device 7f and displayed by a display processing unit 7e according to circumstances.

In such a magnetic resonance imaging apparatus 1, for speedup of imaging, the RF coil 4 includes a whole-body (WB) coil for transmission and a phased-array coil (PAC) serving as a main coil for reception (see, for example, Roemer P B, et al. The NMR Phased-array, MRM 16, 192-225 (1990)). The phased-array coil includes plural surface coils. Thus, the phased-array coil can reduce imaging time by receiving NMR signals using the respective surface coils simultaneously and collecting a large number of raw data in a short time.

Here, in image diagnosis by the magnetic resonance imaging apparatus 1, it is desired that luminance unevenness (signal intensity unevenness) does not occur in image data that is obtained finally. However, when the RF coil 4 is constituted by the phased-array coil including the plural surface coils, because of non-uniformity of sensitivities of the respective surface coils constituting the RF coil 4, non-uniformity occurs not only in signal intensities of the NMR signals but also in signal intensities of the image data simply obtained by the reconstruction processing according to the Fourier transformation of the raw data. Thus, luminance unevenness occurs in the image data.

Thus, conventionally, a sensitivity pre-scan is executed prior to a main scan to generate an image of the patient P. Then, image data are acquired from the phased-array coil and the WB coil by the sensitivity pre-scan. A sensitivity distribution of the phased-array coil is estimated as three-dimensional sensitivity map data on the basis of a signal intensity ratio ($S_{PAC}/S_{WB}$), which is a division value of signal intensities $S_{PAC}$ and $S_{WB}$ of the respective image data, by a procedure of a flowchart shown in FIG. 25. Luminance of the image data is corrected by the obtained three-dimensional sensitivity map data.

First, a sequence for sensitivity estimation is given to the sequence controller control unit 7a by the sensitivity pre-scan execution unit 7g and sensitivity pre-scan is executed. A WB reconstructed image obtained by the WB coil and a PAC reconstructed image obtained by the phased-array coil are stored in a WB reconstructed image database 7h and a PAC reconstructed image database 7i, respectively.

An estimated value of a sensitivity distribution of the phased-array coil is calculated by a sensitivity distribution estimating unit 7j on the basis of the WB reconstructed image and the PAC reconstructed image.

In step S1, threshold value processing is executed on the WB reconstructed image and the PAC reconstructed image by a threshold value processing unit 7k. In other words, regions, where signal intensities of the WB reconstructed image and the PAC reconstructed image are equal to or lower than a threshold value, are masked and WB absolute value image data and PAC absolute value image data are generated.

Next, in step S2, a region reduction unit 7l reduces regions after the threshold value processing of the PAC reconstructed image and the WB reconstructed image according to region reduction processing and excludes sections with small signal intensities near the mask regions from data for three-dimensional sensitivity map generation.

Next, in step S3, a division processing unit 7m divides a PAC absolute value image (a signal absolute value of the PAC reconstructed image) in each slice after the threshold value processing and the region reduction processing by a WB absolute value image (a signal absolute value of the WB reconstructed image) to thereby calculate a signal intensity ratio of the PAC absolute value image and the WB absolute value image as three-dimensional sensitivity map data.

Next, in step S4, normalization processing for the three-dimensional sensitivity map data, which is calculated as the signal intensity ratio of the PAC absolute value image and the WB absolute value image, is carried out by a normalizing unit 7n for each slice.

Next, in step 5, a patient inner region interpolating unit 7o applies linear interpolation processing to a no-signal region in the patient P of the three-dimensional sensitivity map data after the normalization processing.

Next, in step S6, in order to estimate a sensitivity distribution in a no-signal region outside the patient, region growing processing is carried out by a patient outer region interpolating unit 7p and a sensitivity distribution of the no-signal region outside the patient is interpolated.

Next, in step S7, a slice direction weighting unit 7q corrects the three-dimensional sensitivity map data by weighting the three-dimensional sensitivity map data in a slice direction such that a sensitivity distribution in the slice direction is made uniform.

Next, in step S8, various kinds of processing such as fitting processing and smoothing processing are carried out by a smoothing processing unit 7r. A sensitivity map is created as volume data in an entire three-dimensional region and stored in a sensitivity map database 7s.

Further, an image acquiring sequence is given to the sequence controller control unit 7a by a main scan execution unit 7t and a main scan is executed. Then, image data is obtained by image reconstruction processing of the image reconstructing unit 7c and stored in the image data database 7d. Moreover, an image data correcting unit 7u corrects luminance of the image data stored in the image data database 7d using the sensitivity map stored in the sensitivity map database 7s. Image data after the luminance correction is given to the display device 7f and displayed by the display processing unit 7e.

In general, a no-signal region is included in image data obtained by the sensitivity pre-scan and the main scan. This is because regions such as lungs are present in a patient forming an imaging region and a no-signal region, where an NMR signal is not generated, is present. Here, in general, a phenomenon in which a signal intensity decreases occurs in a signal region near a boundary of a no-signal region and a signal region in a patient. This affects an estimated value of a sensitivity distribution of the phased-array coil.

However, in the conventional magnetic resonance imaging apparatus 1, in the method of interpolating a no-signal region in creating a sensitivity map of the phased-array coil, the region growing processing is only carried out for the no-signal region regardless of the inside and the outside of the patient.

Moreover, the sensitivity pre-scan using the phased-array coil and the sensitivity pre-scan using the WB coil are carried out separately. Thus, it is likely that a gap occurs between a shape of the patient P in the image data acquired by using the phased-array coil and a shape of the patient P in the image data acquired by using the WB coil.

In addition, non-uniformity occurs in signal intensities in a Z-axis direction of a device coordinate system because of not only a sensitivity distribution but also an arrangement characteristic of the respective surface coils of the phased-array coil.

However, in the conventional magnetic resonance imaging apparatus 1, non-uniformity of signal intensities due to the misregistration of image data in the sensitivity pre-scan and the arrangement characteristic of the surface coils is not taken into account. A sensitivity distribution of the phased-array coil is estimated on the basis of a signal intensity ratio of the PAC absolute value image data and the WB absolute value image data, which are obtained simply by applying the threshold value processing to the respective signal intensities of the WB reconstructed image data and the PAC reconstructed image data, respectively, and a sensitivity map is generated.

As a result, in the conventional magnetic resonance imaging apparatus 1, a problem occurs in that accuracy of the sensitivity distribution of the phased-array coil estimated by the sensitivity pre-scan is not obtained sufficiently and luminance of the reconstructed image obtained by the main scan cannot be corrected at sufficient accuracy.

In addition, conventionally, as a monitoring apparatus in medical spots, a magnetic resonance imaging apparatus 1 shown in FIG. 26 is also used (see, for example, Japanese Patent No. 3135592).

As described above, when the RF coil 4 is constituted by the phased-array coil and the WB coil, because of non-uniformity in sensitivities of the phased-array coil and the WB coil, non-uniformity occurs not only in signal intensities of NMR signals but also in signal intensities of image data obtained by the reconstruction processing. In general, non-uniformity in sensitivities of the WB coil is so small as to be negligible. However, in particular, non-uniformity in sensitivities of the surface coils in the phased-array coil serving as coils adapted to respective purposes is large, which affects image data.

Therefore, it is necessary to correct the non-uniformity in signal intensities in image data due to the non-uniformity in sensitivities of the phased-array coil.

Thus, in the magnetic resonance imaging apparatus 1 shown in FIG. 26, as shown in a flowchart in FIG. 27, in step S1, a sequence for sensitivity estimation is given to the sequence controller control unit 7a by a sensitivity pre-scan executing unit 7g and sensitivity pre-scan is executed using the phased-array coil and the WB coil as reception coils. Then, WB coil image data obtained by the WB coil and main coil image data obtained by the phased-array coil are acquired as image data for estimating a sensitivity distribution of the phased-array coil and stored in a WB coil image database 7h and a main coil image database 7v, respectively. Therefore, imaging of volume data, which is three-dimensional image data, is carried out twice.

Next, in step S2, an estimated value of a sensitivity distribution of the phased-array coil is calculated by a sensitivity distribution estimating unit 7j. A signal intensity $S_{PAC}$ of main coil image data shown in (a) in FIG. 28 is divided by a signal intensity $S_{WB}$ of WB coil image data shown in (b) in FIG. 28 by a division processing unit 7w, whereby a signal intensity ratio ($S_{PAC}/S_{WB}$) of the main coil image data and the WB coil image data shown in (c) in FIG. 28 is calculated as an estimated value of a sensitivity distribution of the phased-array coil.

In this case, in order to prevent division processing from being applied to regions where the signal intensities $S_{PAC}$ and $S_{WB}$ of the main coil image data and the WB coil image data are less than a threshold value, for example, less than 10% of a maximum value, threshold value processing for the respective signal intensities $S_{PAC}$ and $S_{WB}$ is carried out by a threshold value processing unit 7x as pre-processing of the division processing as required. The respective signal intensities $S_{PAC}$ and $S_{WB}$ in the regions, where the signal intensities $S_{PAC}$ and $S_{WB}$ of the main coil image data and the WB coil image data are less than the threshold value, are masked.

Influence of image data on signal intensities, which is caused by factors other than non-uniformity in a sensitivity distribution of the phased-array coil such as an image contrast, is cancelled by the division processing having this threshold value processing as pre-processing. Thus, it is possible to estimate a sensitivity distribution at satisfactory accuracy.

Next, interpolation or extrapolation is applied to a no-signal region, which is a data absence section caused by the threshold value processing because of presence of the lung fields or the like, by an interpolation unit 7y to estimate a sensitivity distribution. Further, fitting processing and smoothing processing are carried out over an entire two-dimensional region by a smoothing processing unit 7z to obtain an estimated value curve of the sensitivity distribution shown in (d) in FIG. 28.

Then, the same processing for image data is carried out over respective sections of an entire three-dimensional region to obtain an estimated value of the sensitivity distribution as volume data.

Next, in step S3, the estimated value of the sensitivity distribution of the phased-array coil is stored in the sensitivity map database 7s as three-dimensional sensitivity map data.

Next, in step S4, a sequence for image acquisition is given to the sequence controller control unit 7a by the main scan executing unit 7t and main scan is executed using the phased-array coil as a reception coil. Then, row data is collected and image data is obtained by image reconstruction processing of the image reconstructing unit 7c.

Next, in step S5, according to conditions such as an imaging condition including an imaging sectional direction and spatial resolution, a data collection condition, and an image reconstruction condition in the main scan, an image data correcting unit 7u slices corresponding three-dimensional sensitivity map data from the sensitivity map database 7s.

Then, in step S6, the image data correcting unit 7u corrects the image data using the sliced three-dimensional sensitivity map data. Consequently, non-uniformity in signal intensities of the image data is corrected.

On the other hand, a method of estimating a sensitivity distribution of the phased-array coil as sensitivity map data from image data itself, which is obtained from NMR signals received by the phased-array coil, according to post-processing and correcting signal intensity unevenness of the image data using the obtained sensitivity map data of the phased-array coil is also used. For example, there is a method of generating image data of an extremely low frequency component by executing smoothing processing on the image data obtained by the phased-array coil and substituting the image data for a sensitivity distribution.

In addition, there have been proposed a technique for correcting signal intensity unevenness of image data, which is obtained from NMR signals received by a phased-array coil, with reference to a signal intensity of a radiofrequency signal transmitted from a WB coil (see, for example, JP-A-63-132645) and a technique for correcting signal intensity unevenness of image data using a sensitivity distribution of a phased-array coil stored in advance and position information of the phased-array coil obtained by estimation from image data (see, for example, JP-A-7-59750).

However, in the conventional method of estimating a sensitivity distribution of a phased-array coil on the basis of a division value ($Sig_{PAC}/Sig_{WB}$) of signal intensity values $Sig_{PAC}$ and $Sig_{WB}$ of image data obtained from a phased-array coil and a WB coil by sensitivity pre-scan and correcting signal intensities of the image data, there is a problem in that the time required for the sensitivity pre-scan is long. Therefore, for example, when an abdomen of a patient P is imaged, breath-holding time is extended according to execution time of the sensitivity pre-scan.

In addition, it is likely that misregistration in the patient P occurs between collection of image data using the phased-array coil and collection of image data using the WB coil because of a cause such as movement of the patient P or the like. Moreover, in order to acquire image data from both the phased-array coil and the WB coil, decoupling between the phased-array coil and the WB coil is required to be complete.

On the other hand, in the method of correcting signal intensity unevenness of image data using a sensitivity distribution of a phased-array coil estimated by post-processing from the image data itself obtained by the phased-array coil, correction of signal intensities of the image data is insufficient because accuracy of estimation of a sensitivity distribution of the phased-array coil is low. Thus, it is impossible to obtain uniformity of image data after correction, which is obtained finally, sufficiently.

There is also a problem in that it is difficult to always apply correction to various image types at sufficient accuracy. For example, when image data is image data having a desired contrast like T1 weighted image data and T2 weighted image data, even if the smoothing processing is applied to the image data to estimate a sensitivity distribution, image data showing the sensitivity distribution also has a contrast. Thus, it is impossible to use image data after the smoothing processing as a sensitivity distribution.

Moreover, it is difficult to consistently perform correction of image data in all slices in imaging by multi-slice.

The invention has been devised in order to cope with such conventional circumstances and it is an object of the invention to provide a magnetic resonance imaging apparatus that is capable of estimating a sensitivity distribution of an RF coil accurately on the basis of image data obtained by implementation of sensitivity pre-scan and correcting luminance of image data obtained by implementation of main scan satisfactorily on the basis of the obtained sensitivity distribution of the RF coil and a data processing method for the magnetic resonance imaging apparatus.

It is another object of the invention to provide a magnetic resonance imaging apparatus that is capable of correcting signal intensity unevenness of image data due to non-uniformity in a sensitivity distribution of a reception coil in a shorter time and at satisfactory accuracy regardless of an imaging condition such as image types and a data processing method for the magnetic resonance imaging apparatus.

DISCLOSURE OF THE INVENTION

In order to attain the object, a magnetic resonance imaging apparatus according to the invention includes: a scan executing unit that executes scan to generate sensitivity map data of an RF coil; a region reduction unit that applies region reduction to a signal region near a no-signal region of image data obtained by the scan; a sensitivity map data generating unit that generates sensitivity map data using the image data after the region reduction; and a smoothing processing unit that applies three-dimensional smoothing filter to the sensitivity map data.

In order to attain the object, a magnetic resonance imaging apparatus according to the invention includes: a scan executing unit that executes scan to generate sensitivity map data of an RF coil; a sensitivity map data generating unit that generates sensitivity map data using image data obtained by the scan; a linear interpolation unit that linearly interpolates a no-signal region in a patient of the sensitivity map data; and a smoothing processing unit that applies three-dimensional smoothing filter to the sensitivity map data.

In order to attain the object, a magnetic resonance imaging apparatus according to the invention includes: a scan executing unit that executes scan to generate sensitivity correction data for a reception coil in imaging using the reception coil in the imaging as a reception coil; and a sensitivity correction data generating unit that generates the sensitivity correction data using only data acquired by the reception coil in the imaging in the scanning as original data.

In order to attain the object, a data processing method for a magnetic resonance imaging apparatus according to the invention includes: a step of applying region reduction to a signal region near a no-signal region of image data obtained by scan to generate sensitivity map data of an RF coil; a step of generating sensitivity map data using the image data after the region reduction; and a step of applying three-dimensional smoothing filter to the sensitivity map data.

In order to attain the object, a data processing method for a magnetic resonance imaging apparatus according to the invention includes: a step of generating sensitivity map data using image data obtained by scan to generate sensitivity map data of an RF coil; a step of linearly interpolating a no-signal region in a patient of the sensitivity map data; and a step of applying three-dimensional smoothing filter to the sensitivity map data.

In order to attain the object, a data processing method for a magnetic resonance imaging apparatus according to the invention includes: executing scan to generate sensitivity correction data for a reception coil in imaging using the reception coil in the imaging as a reception coil; and generating the sensitivity correction data using only data acquired by the reception coil in the imaging in the scan as original data.

In such magnetic resonance imaging apparatuses and data processing methods for a magnetic resonance imaging apparatus, it is possible to estimate a sensitivity distribution of the RF coil accurately on the basis of image data obtained by implementation of sensitivity pre-scan and correct luminance of image data obtained by implementation of main scan more satisfactorily on the basis of the obtained sensitivity distribution of the RF coil.

In addition, it is possible to correct signal intensity unevenness of image data due to non-uniformity of a sensitivity distribution of the reception coil in a shorter time and at satisfactory accuracy regardless of an imaging condition such as image types.

BRIEF DESCRIPTION OF THE DRAWINGS

FIG. 4 is a flowchart showing a procedure in imaging a sectional image of a patient using the magnetic resonance imaging apparatus shown in FIG. 1;

FIG. 5 is a flowchart showing a detailed procedure in generating sensitivity map data using the magnetic resonance imaging apparatus shown in FIG. 1;

FIG. 10 is a diagram showing an example of region growing applied to a no-signal region outside a patient of three-dimensional sensitivity map data by the magnetic resonance imaging apparatus shown in FIG. 1;

FIG. 11 is a diagram in which a correction coefficient in carrying out weighting in a slice direction of three-dimensional sensitivity map data is plotted by the magnetic resonance imaging apparatus shown in FIG. 1;

FIG. 20 is a diagram showing data that is generated when three-dimensional sensitivity map data is generated by a conventional magnetic resonance imaging apparatus;

BEST MODE FOR CARRYING OUT THE INVENTION

A magnetic resonance imaging apparatus and a data processing method for the magnetic resonance imaging apparatus according to the invention will be explained with reference to the attached drawings.

Figure 1:
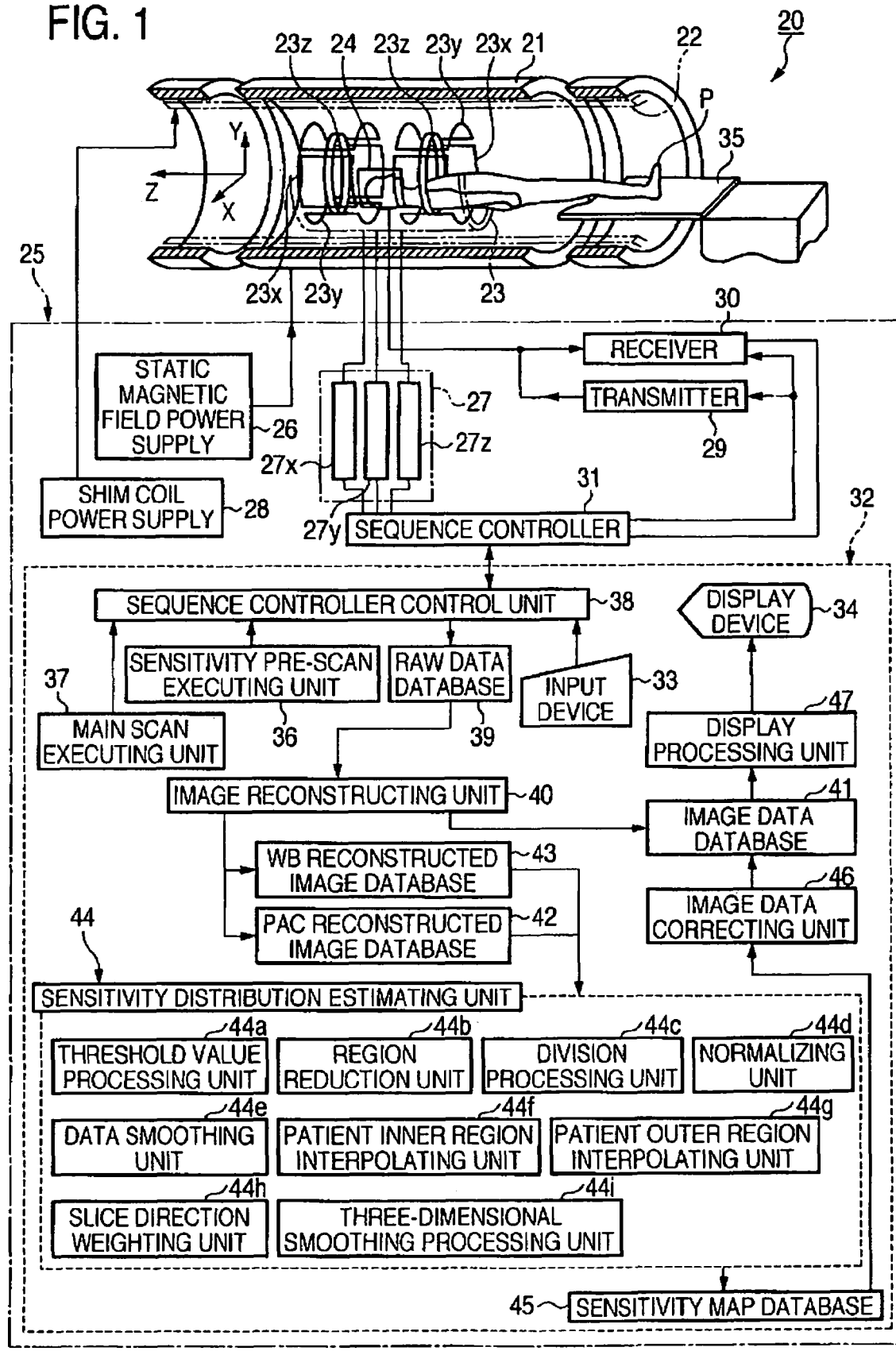
FIG. 1 is a block diagram showing an embodiment of a magnetic resonance imaging apparatus according to the invention.

FIG. 1 is a functional block diagram showing a first embodiment of the magnetic resonance imaging apparatus according to the invention.

A magnetic resonance imaging apparatus 20 has a structure in which a cylindrical magnet for static magnetic field 21 for forming a static magnetic field, a shim coil 22 provided inside this magnet for static magnetic field 21, and a gradient magnetic field coil unit 23 and an RF coil 24 are incorporated in a not-shown gantry.

The magnetic resonance imaging apparatus 20 includes a control system 25. The control system 25 includes a static magnetic field power supply 26, a gradient magnetic field power supply 27, a shim coil power supply 28, a transmitter 29, a receiver 30, a sequence controller 31, and a computer 32. The gradient magnetic field power supply 27 of the control system 25 includes an X-axis gradient magnetic field power supply 27x, a Y-axis gradient magnetic field power supply 27y, and a Z-axis gradient magnetic power supply 27z. The computer 32 includes a computing device and a storing device, which are not shown in the figure, and is provided with an input device 33 and a display device 34.

The magnet for static magnetic field 21 is connected to the static magnetic field power supply 26 and has a function of forming a static magnetic field in an imaging region with an electric current supplied from the static magnetic field power supply 26. On the inner side of the magnet for static magnetic field 21, the cylindrical shim coil 22 is provided coaxially. The shim coil 22 is connected to the shim coil power supply 28 such that an electric current is supplied from the shim coil power supply 28 to the shim coil 22 and the static magnetic field is uniformalized.

The gradient magnetic field coil unit 23 includes an X-axis gradient magnetic field coil 23x, a Y-axis gradient magnetic field coil 23y, and a Z-axis gradient magnetic field coil 23z and is formed in a cylindrical shape in the magnet for static magnetic field 21. A bed 35 is provided on the inner side of the gradient magnetic field coil unit 23 to be used as an imaging region. A patient P is set on the bed 35. It is also possible that the RF coil 24 is not incorporated in the gantry and is provided near the bed 35 or the patient P.

The gradient magnetic field coil unit 23 is connected to the gradient magnetic field power supply 27. The X-axis gradient magnetic field coil 23x, the Y-axis gradient magnetic field coil 23y, and the Z-axis gradient magnetic field coil 23z of the gradient magnetic field coil unit 23 are connected to the X-axis gradient magnetic field power supply 27x, the Y-axis gradient magnetic field power supply 27y, and the Z-axis gradient magnetic field power supply 27z of the gradient magnetic field power supply 27, respectively.

The X-axis gradient magnetic field coil 23x, the Y-axis gradient magnetic field coil 23y, and the Z-axis gradient magnetic field coil 23z of the gradient magnetic field coil unit 23 are constituted such that a gradient magnetic field Gx in the X-axis direction, a gradient magnetic field Gy in the Y-axis direction, and a gradient magnetic field Gz in the Z-axis direction can be formed in the imaging region by electric currents supplied form the X-axis gradient magnetic field power supply 27x, the Y-axis gradient magnetic field power supply 27y, and the Z-axis gradient magnetic field power supply 27z to the X-axis gradient magnetic field coil 23x, the Y-axis gradient magnetic field coil 23y, and the Z-axis gradient magnetic field coil 23z, respectively.

The RF coil 24 is connected to the transmitter 29 and the receiver 30. The RF coil 24 has a function of receiving a radiofrequency signal from the transmitter 29 and transmitting the radiofrequency signal to the patient P and a function of receiving an NMR signal, which is generated according to excitation by a radiofrequency signal of a nuclear spin in the patient P, and giving the NMR signal to the receiver 30.

Figure 2:
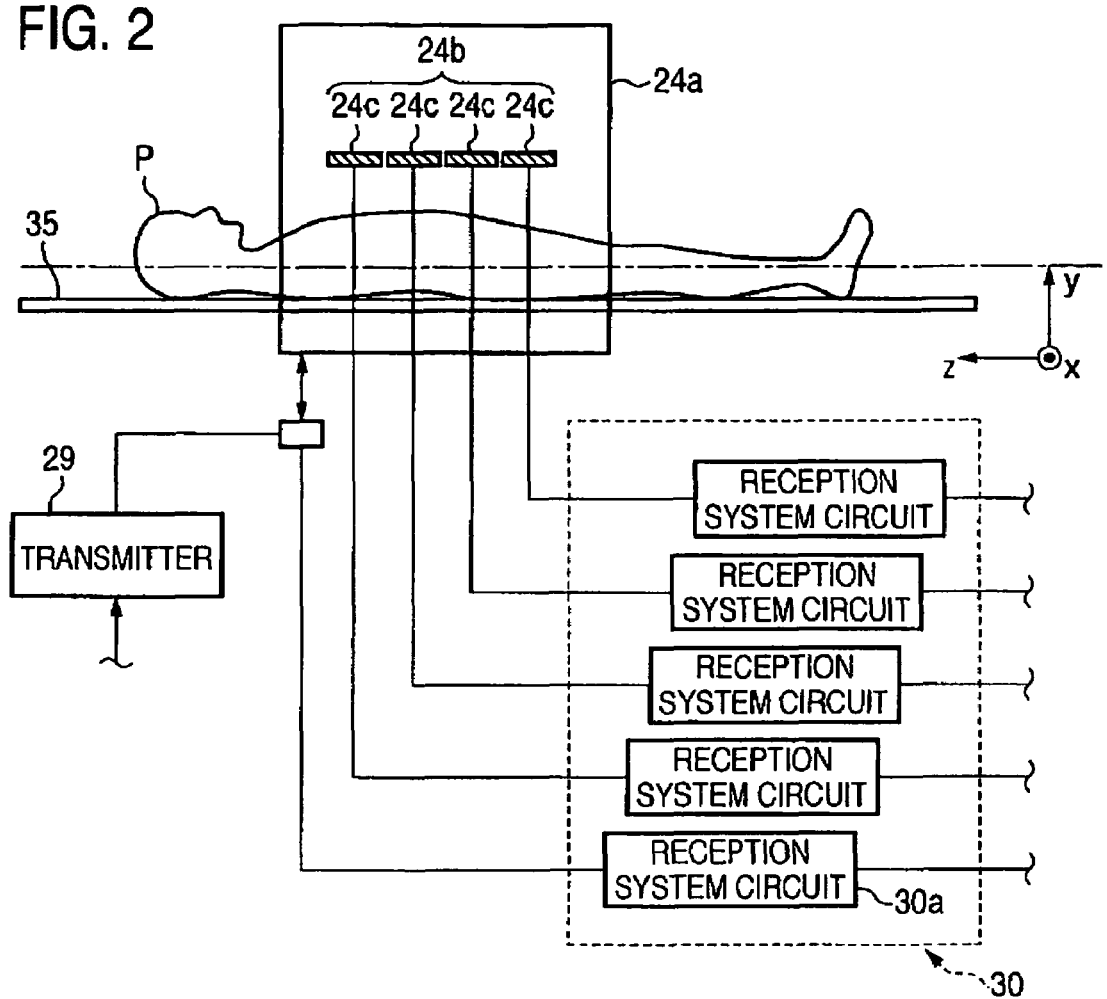
FIG. 2 is a detailed diagram of an RF coil and a receiver shown in FIG. 1.

FIG. 2 is a detailed diagram of the RF coil 24 and the receiver 30 shown in FIG. 1.

The RF coil 24 includes, for example, a WB coil 24a for radiofrequency signal transmission and a phased-array coil 24b for NMR signal reception. The phased-array coil 24b includes plural surface coils 24c and, on the other hand, the receiver 30 includes plural reception system circuits 30a. The respective surface coils 24c are connected to the respective reception system circuits 30a of the receiver 30 individually. The WB coil is connected to the transmitter 29 and the reception system circuit 30a.

Figure 3:
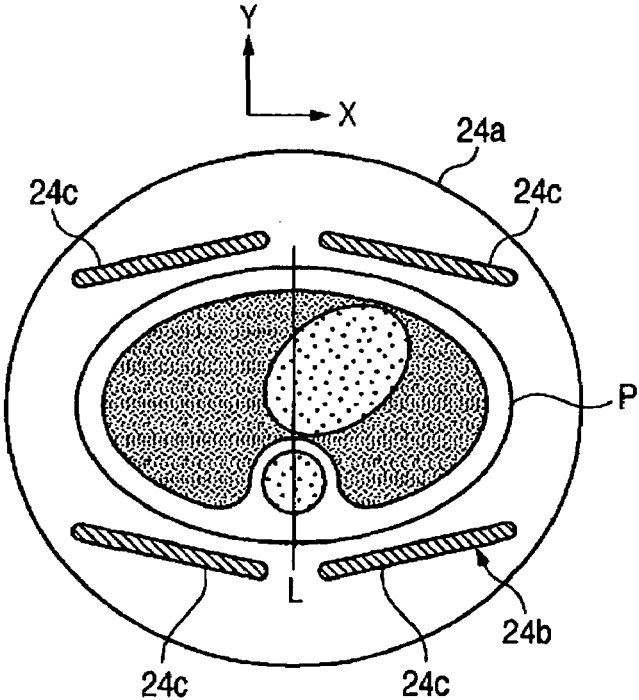
FIG. 3 is a sectional schematic view showing an example of arrangement of a WB coil and a phased-array coil shown in FIG. 2.

FIG. 3 is a sectional schematic view showing an example of arrangement of the WB coil 24a and the phased-array coil 24b shown in FIG. 2.

The respective surface coils 24c of the phased-array coil 24b are arranged symmetrically around a Z-axis, that is, for example, a periphery of a section L including a specific region of interest of the patient P. The WB coil 24a is provided on the outer side of the phased-array coil 24b. The RF coil 24 is constituted such that the RF coil 24 can transmit a radiofrequency signal to the patient P using the WB coil 24a and, on the other hand, receive an NMR signal from the section L including the specific region of interest in multi-channel using the WB coil 24a or the respective surface coils 24c of the phased-array coil 24b and give the NMR signal to the respective reception system circuit 30a of the receiver 30.

On the other hand, the sequence controller 31 of the control system 25 is connected to the gradient magnetic field power supply 27, the transmitter 29, and the receiver 30. The sequence controller 31 has a function of storing sequence information describing control information necessary for driving the gradient magnetic field power supply 27, the transmitter 29, and the receiver 30, for example, operation control information such as intensity, application time, and application timing of a pulse current that should be applied to the gradient magnetic field power supply 27 and a function of driving the gradient magnetic field power supply 27, the transmitter 29, and the receiver 30 in accordance with the stored predetermined sequence to thereby generate the X-axis gradient magnetic field Gx, the Y-axis gradient magnetic field Gy, the Z-axis gradient magnetic field Gz, and a radiofrequency signal.

The sequence controller 31 is constituted to receive raw data, which is a digital NMR signal, from the receiver 30 and give the raw data to the computer 32.

Therefore, the transmitter 29 has a function of giving a radiofrequency signal to the RF coil 24 on the basis of the control information received from the sequence controller 31. On the other hand, the receiver 30 has a function of executing predetermined signal processing on the NMR signal received from the RF coil 24 and subjecting the NMR signal to A/D conversion to thereby generate raw data, which is a digital NMR signal and a function of giving the generated raw data to the sequence controller 31.

As programs are read and executed in the computer 32, the computer 32 functions as a sensitivity pre-scan executing unit 36, a main scan executing unit 37, a sequence controller control unit 38, a raw data database 39, an image reconstructing unit 40, an image database 41, a PAC reconstructed image database 42, a WB reconstructed image database 43, a sensitivity distribution estimating unit 44, a sensitivity map database 45, an image data correcting unit 46, and a display processing unit 47. However, the computer 32 may be constituted by providing specific circuits regardless of the programs.

The sensitivity pre-scan executing unit 36 has a function of generating a sequence in executing sensitivity pre-scan for obtaining three-dimensional sensitivity map data that is a sensitivity distribution of the phased-array coil 24b (a sequence for sensitivity estimation) and a function of giving the generated sequence for sensitivity estimation to the sequence controller control unit 38 to thereby cause the sequence controller control unit 38 to execute the sensitivity pre-scan.

The main scan executing unit 37 has a function of giving various sequences in executing main scan for acquiring image data to the sequence controller control unit 38 to thereby cause the sequence controller control unit 38 to execute the main scan.

The sequence controller control unit 36 has a function of giving a required sequence among sequences received from the sensitivity pre-scan executing unit 36 and the main scan executing unit 37 to the sequence controller 31 on the basis of information from the input device 33 or the other components to thereby cause the sequence controller 31 to execute sensitivity pre-scan or main scan. The sequence controller control unit 38 also has a function of receiving raw data of the WB coil 24a and the respective surface coils 24c of the phased-array coil 24b, which are collected by execution of the sensitivity pre-scan or the main scan, from the sequence controller 31 and arranging the raw data in a K space (a Fourier space) formed in the raw data database 39.

Therefore, the respective raw data of each of the WB coil 24a and the surface coil 24c generated in the receiver 30 are stored in the raw data database 39. In other words, the raw data are arranged in the K space formed in the raw data database 39.

The image reconstructing unit 40 has a function of applying image reconstruction processing such as the Fourier transformation (FT) to the raw data, which are arranged in the K space of the raw data database 39 by the execution of the main scan, to thereby reconstruct image data of the patient P and a function of writing the reconstructed image data in the image data database 41.

The image reconstructing unit 40 also has a function of applying reconstruction processing, which is performed by the same method as the reconstruction processing for the raw data obtained by execution of the main scan, to the raw data, which are arranged in the K space of the raw data database 39 by execution of the sensitivity pre-scan, to thereby generate a PCA reconstructed image and a WB reconstructed image of image data of the patient P, which are obtained by the phased-array coil 24b and the WB coil 24a, respectively, and a function of writing the generated PAC reconstructed image and the generated WB reconstructed image in the PAC reconstructed image database 42 and the WB reconstructed image database 43, respectively.

The sensitivity distribution estimating unit 44 has a function of using the PAC reconstructed image and the WB reconstructed image stored in the PAC reconstructed image database 42 and the WB reconstructed image database 43, respectively, to thereby generate three-dimensional sensitivity map data of the phased-array coil 24b and a function of writing the generated three-dimensional sensitivity map data in the sensitivity map database 45. In other words, the sensitivity distribution estimating unit 44 functions as a sensitivity map data generating unit that generates sensitivity map data of the RF coil 24.

Therefore, the sensitivity distribution estimating unit 44 includes a threshold value processing unit 44a, a region reduction unit 44b, a division processing unit 44c, a normalizing unit 44d, a data smoothing unit 44e, a patient inner region interpolating unit 44f, a patient outer region interpolating unit 44g, a slice direction weighting unit 44h, and a three-dimensional smoothing processing unit 44i.

The threshold value processing unit 44a has a function of applying threshold value processing to the PAC reconstructed image and the WB reconstructed image, that is, a function of masking data in sections where respective signal intensities of the PAC reconstructed image and the WB reconstructed image are equal to or lower than a threshold value set in advance, respectively.

The region reduction unit 44b has a function of reducing regions after the threshold value processing of the PAC reconstructed image and the WB reconstructed image, which are used for estimating a sensitivity distribution, according to region reduction processing and excluding sections with small signal intensities near mask regions from data to generate three-dimensional sensitivity map data.

The division processing unit 44c has a function of dividing a PAC absolute value image, which is a signal absolute value of the PAC reconstructed image after the threshold value processing and the region reduction processing, by a WB absolute value image, which is a signal absolute value of the WB reconstructed image, to thereby calculating a signal intensity ratio of the PAC absolute value image and the WB absolute value image as three-dimensional sensitivity map data.

The normalizing unit 44d has a function of performing normalization processing for the three-dimensional sensitivity map data.

The data smoothing unit 44e has a function of applying data smoothing processing to the three-dimensional sensitivity map data using a transform function and, on the other hand, applying an inverse transform function to the three-dimensional sensitivity map data after the data smoothing processing to thereby obtaining three-dimensional sensitivity map data before the data smoothing processing. In other words, the data smoothing unit 44e has a function as a data smoothing unit that transforms the three-dimensional sensitivity map data into a smoothed distribution suitable for linear interpolation once and brings the three-dimensional sensitivity map data after the linear interpolation processing back to an original distribution. Therefore, it is possible to use an arbitrary function as the transform function depending on a purpose.

The patient inner region interpolating unit 44f has a function as a liner interpolation unit that applies linear interpolation processing to a no-signal region in the patient P of the three-dimensional sensitivity map data.

The patient outer region interpolating unit 44g has a function as a region growing unit that applies region growing processing to a no-signal region outside the patient P of the three-dimensional sensitivity map data to thereby interpolating the no-signal region.

The slice direction weighting unit 44h has a function of weighting the three-dimensional sensitivity map data in a slice direction.

The three-dimensional smoothing processing unit 44i has a function as a smoothing processing unit that applies a three-dimensional smoothing filter to the three-dimensional sensitivity map data.

The image data correcting unit 46 has a function of slicing and extracting three-dimensional sensitivity map data corresponding to image data acquisition conditions such as an imaging condition, a data collection condition, and an image reconstruction condition in main scan from the three-dimensional sensitivity map data stored in the sensitivity map database 45 and a function of correcting luminance of the image data stored in the image data database 41 according to execution of the main scan using the extracted three-dimensional sensitivity map data.

The display processing unit 47 has a function of giving the image data stored in the image data database 41 to the display device 34 to cause the display device 34 to display the image data.

The magnetic resonance imaging apparatus 20 having the structure described above functions as a whole, with the respective components, as a scan executing unit that executes scan such as main scan and sensitivity pre-scan, a region reduction unit that applies region reduction to a signal region near a no-signal region of image data acquired in the sensitivity pre-scan, and a sensitivity map data generating unit that generates sensitivity map data using the image data acquired in the sensitivity pre-scan, and a slice direction weighting unit that weights the sensitivity map data in a slice direction to thereby correct the sensitivity map data.

Next, actions of the magnetic resonance imaging apparatus 20 will be explained.

FIG. 4 is a flowchart showing a procedure in imaging a tomographic image of the patient P using the magnetic resonance imaging apparatus 20 shown in FIG. 1. Reference signs S attached with numbers in the figure denote respective steps of the flowchart.

First, in step S10, a sequence for sensitivity estimation is given to the sequence controller control unit 7a by the sensitivity pre-scan executing unit 36 and sensitivity pre-scan for obtaining sensitivity map data of the phased-array coil 24b is executed prior to main scan for acquiring image data.

The patient P is set on the bed 35 in advance and an electric current is supplied from the static magnetic field power supply 26 to the magnet for static magnetic field 21 to form a static magnetic field in an imaging region. In addition, an electric current is supplied from the shim coil power supply 28 to the shim coil 22 to uniformalize the static magnetic field formed in the imaging region.

Next, an operation command is given to the sequence controller control unit 38 from the input device 33. Therefore, the sequence controller control unit 38 gives the sequence for sensitivity estimation to the sequence controller 31. The sequence controller 31 drives the gradient magnetic power supply 27, the transmitter 29, and the receiver 30 in accordance with the sequence for sensitivity estimation to thereby form the X-axis gradient magnetic field Gx, the Y-axis gradient magnetic field Gy, and the Z-axis gradient magnetic field Gz in the imaging region where the patient P is set and generate a radiofrequency signal.

In this case, the X-axis gradient magnetic field Gx, the Y-axis gradient magnetic field Gy, and the Z-axis gradient magnetic field Gz formed by the gradient magnetic field coil are used mainly as a phase encoding (PE) gradient magnetic field, a readout (RO) gradient magnetic field, and a slice encoding (SE) gradient magnetic field, respectively. Consequently, regularity appears in a rotating direction of a nuclear spin in the patient P. An X coordinate and a Y coordinate, which are two-dimensional position information in a slice formed in the Z-axis direction by the SE gradient magnetic field, are transformed into an amount of phase change and an amount of frequency change of the nuclear spin in the patient P by the PE gradient magnetic field and the RO gradient magnetic field, respectively.

Then, a radiofrequency signal is given to the WB coil 24a of the RF coil 24 from the transmitter 29 according to the sequence for sensitivity estimation and the radiofrequency signal is transmitted from the WB coil 24a to the patient P. Moreover, an NMR signal, which is generated by nuclear magnetic resonance of an atomic nucleus included in a slice corresponding to a frequency of the radiofrequency signal in the patient P, is received in multi-channel by the WB coil 24a of the RF coil 24 and the respective surface coils 24c of the phased-array coil 24b and given to the receiver 30.

The receiver 30 receives NMR signals from the WB coil 24a and the respective surface coils 24c of the phased-array coil 24b and executes various kinds of signal processing such as pre-amplification, intermediate frequency transformation, phase detection, low frequency amplification, and filtering. Moreover, the receiver 30 subjects the NMR signals to A/D conversion to thereby generate raw data that are NMR signals of digital data. The receiver 30 gives the generated raw data to the sequence controller 31.

The sequence controller 31 gives the raw data received from the receiver 30 to the sequence controller control unit 38. The sequence controller control unit 38 arranges the raw data in the K space formed in the raw data database 39. Moreover, the image reconstructing unit 40 executes the Fourier transformation (FT) on the obtained raw data using the WB coil 24a and the phased-array coil 24b to thereby generate a WB reconstructed image and a PAC reconstructed image, which are three-dimensional image data of the patient P, and write the WB reconstructed image and the PAC reconstructed image in the WB reconstructed image database 43 and the PAC reconstructed image database 42, respectively.

In this case, a reconstruction processing method for raw data collected by the sensitivity pre-scan is the same as a reconstruction processing method in the main scan. As the reconstruction processing method using the phased-array coil 24b in the main scan, there are Sum of Square processing (SoS processing) for calculating a root sum square of image data obtained by the respective surface coils 24c and a reconstruction processing method for calculating a sum of signal intensity absolute values of image data obtained by the respective surface coils 24c.

Next, in step S11, the sensitivity distribution estimating unit 44 generates three-dimensional sensitivity map data by using the WB reconstructed image and the PAC reconstructed image in the respective slices stored in the WB reconstructed image database 43 and the PAC reconstructed image database 42.

FIG. 5 is a flowchart showing a detailed procedure in generating sensitivity map data using the magnetic resonance imaging apparatus 20 shown in FIG. 1. Reference signs S attached with numbers in the figure denote respective steps of the flowchart.

First, in step S20, the threshold value processing unit 44a applies threshold value processing to a PAC reconstructed image and a WB reconstructed image to mask data of sections where respective signal intensities of the PAC reconstructed image and the WB reconstructed image are equal to or lower than a threshold value set in advance, respectively. Consequently, the PAC reconstructed image and the WB reconstructed image of regions, where signal intensities are equal to or lower than the threshold value and which are shown as no-signal regions, such as lung fields and a region outside a patient are excluded from data to generate three-dimensional sensitivity map data.

Next, in step S21, the region reduction unit 44b reduces regions after the threshold value processing of the PAC reconstructed image and the WB reconstructed image used for estimating a sensitivity distribution according to region reduction processing and excludes sections with small signal intensities near the mask regions from data to generate three-dimensional sensitivity map data.

Figure 6A:
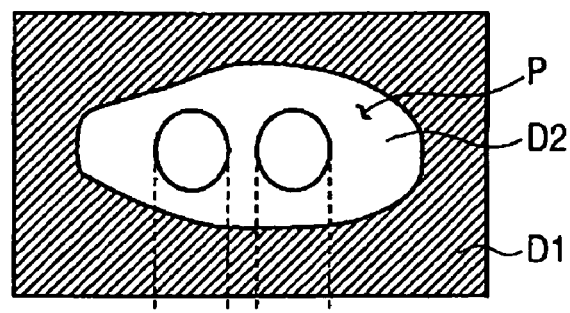
FIG. 6 is a diagram showing an example of region reduction processing by the magnetic resonance imaging apparatus shown in FIG. 1.
Figure 6B:
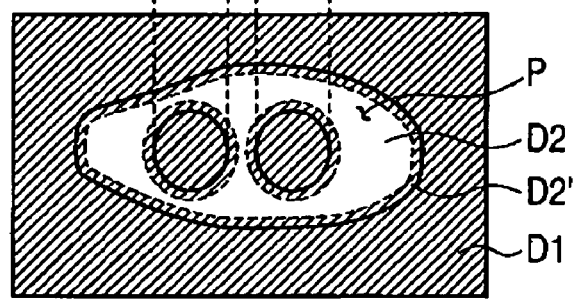

FIG. 6 is a diagram showing an example of the region reduction processing by the magnetic resonance imaging apparatus 20 shown in FIG. 1.

As shown in (a) in FIG. 6, a PAC reconstructed image and a WB reconstructed image before region reduction have a no-signal region D1 and a signal region D2 masked by threshold value processing. However, in general, a phenomenon in which a signal intensity is small in the signal region D2 near the no-signal region D1 occurs. In addition, sensitivity pre-scan using the phased-array coil 24b and sensitivity pre-scan using the WB coil 24a are carried out individually. Thus, when a gap occurs in a position of an internal organ or the like of the patient P, if a signal intensity ratio of the PAC reconstructed image and the WB reconstructed image is calculated in that state, a signal intensity in the signal region D2 near the no-signal region D1 is discontinuous.

Thus, as shown in (b) in FIG. 6, a section D2' near the no-signal region D1 of the signal region D2 is replaced with a no-signal region to reduce the signal region D2. As a result, the signal region D2, where the signal intensity is small, near each of the no-signal region D1 in the PAC reconstructed image and the WB reconstructed image is excluded from the data to generate three-dimensional sensitivity map data.

Next, in step S22, the division processing unit 44c divides a PAC absolute value image, which is a signal absolute value of the PAC reconstructed image in each slice after the threshold value processing and the region reduction processing, by a WB absolute value image, which is a signal absolute value of the WB reconstructed signal, to thereby calculate a signal intensity ratio of the PAC absolute value and the WB absolute value image as three-dimensional sensitivity map data.

Next, in step S23, normalization processing for the three-dimensional map data, which is calculated as a signal intensity ratio of the PAC absolute value image and the WB absolute value image, is carried out by the normalizing unit 44d for each slice.

Next, in step S24, data smoothing processing using a transform function is applied to the three-dimensional sensitivity map data after the normalization processing by the data smoothing unit 44e and the three-dimensional sensitivity map data is transformed into smooth data suitable for linear interpolation. For example, fitting for the three-dimensional sensitivity map data is carried out by an arbitrary function such as an nth function, an exponential function, or a logarithmic function. Processing for reducing local corrugation of data affecting linear interpolation is carried out.

Next, in step S25, the patient inner region interpolating unit 44f applies linear interpolation processing to a no-signal region in the patient P of the three-dimensional sensitivity map data after the data smoothing processing.

Figure 7A:
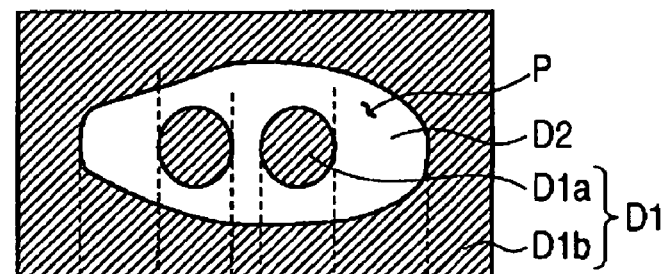
FIG. 7 is a diagram showing an example of linear interpolation applied to a no-signal region in a patient of three-dimensional sensitivity map data by the magnetic resonance imaging apparatus shown in FIG. 1.
Figure 7B:
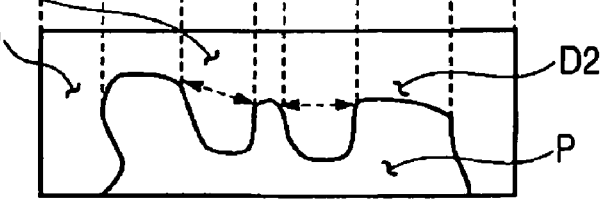

FIG. 7 is a diagram showing an example of linear interpolation applied to a no-signal region in the patient P of three-dimensional sensitivity map data by the magnetic resonance imaging apparatus 20 shown in FIG. 1.

(a) in FIG. 7 is a diagram showing an example of three-dimensional sensitivity map data viewed form a slice direction. (b) in FIG. 7 is a diagram showing an example of the three-dimensional sensitivity map data viewed from an E direction. The three-dimensional sensitivity map data after the normalization processing and the data smoothing processing has a no-signal region D1 and a signal region D2. The no-signal region D1 includes a no-signal region D1a in the patient P and a no-signal region D1b outside the patient P.

Then, as indicated by an arrow in (b) in FIG. 7, the patient inner region interpolating unit 44f linearly interpolates the no-signal region D1a in the patient P by, for example, linearly connecting signal intensity values in the signal region D2 of an RO direction section. As a result, the no-signal region D1a in the patient P is replaced with the signal region D2.

Note that it is possible to perform the linear interpolation not only in the RO direction but also in an arbitrary direction such as a PE direction or an SL direction.

Next, in step S26, the data smoothing unit 44e transforms the three-dimensional sensitivity map data after the linear interpolation to a state before the data smoothing using an inverse transform function.

Next, in step S27, the patient outer region interpolating unit 44g applies region growing processing to a no-signal region outside the patient P of the three-dimensional sensitivity map data to thereby interpolate the no-signal region.

Figure 8:
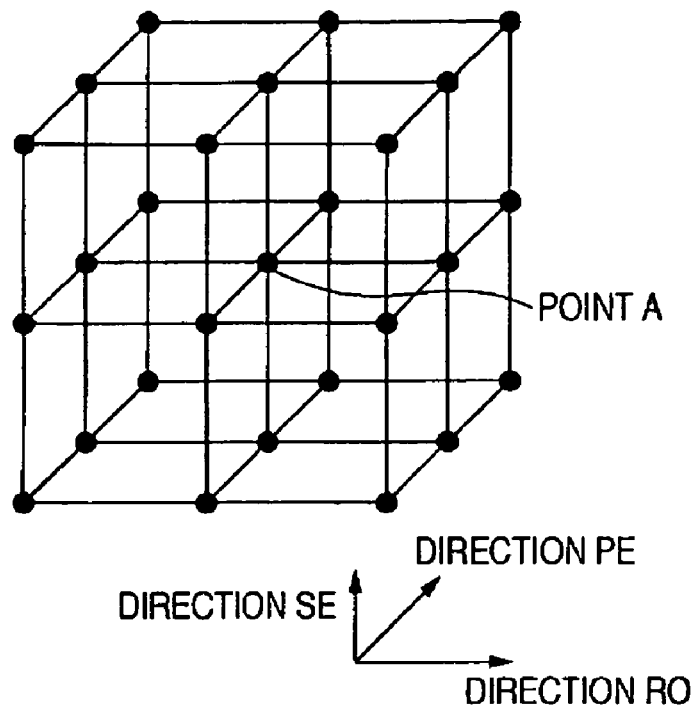
FIG. 8 is an explanatory diagram showing a method in applying region growing to a no-signal region outside a patient of three-dimensional sensitivity map data according to a 26-point method.
Figure 9:
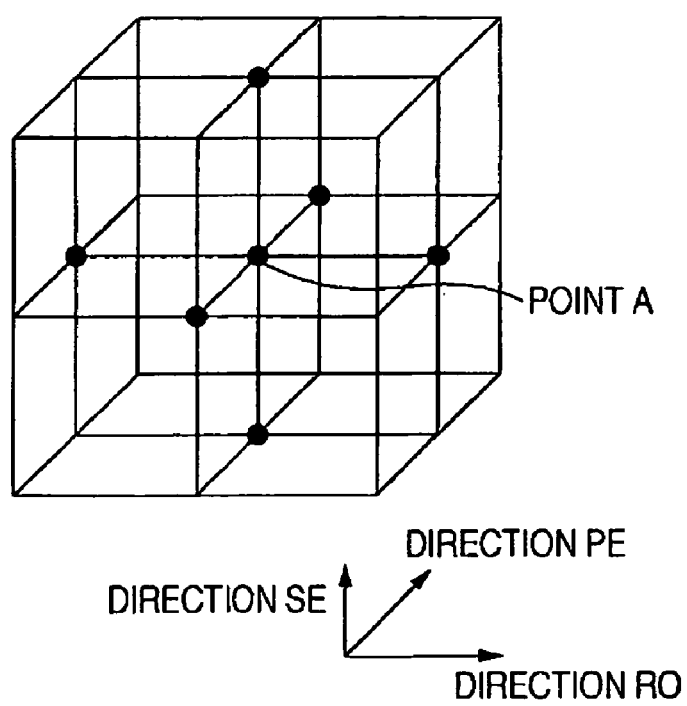
FIG. 9 is an explanatory diagram showing a method in applying region growing to a no-signal region outside a patient in three-dimensional sensitivity map data according to a 6-point method.

FIG. 8 is an explanatory diagram showing a method in applying region growing to a no-signal region outside the patient P of three-dimensional sensitivity map data according to a 26-point method. FIG. 9 is an explanatory diagram showing a method in applying region growing to a no-signal region outside the patient P of three-dimensional sensitivity map data according to a 6-point method.

Region growing is processing for replacing a no-signal region with a value of a signal region directly. For example, region growing according to the 26-point method is processing for, when a signal intensity of a middle point A of a lattice is equal to or larger than a threshold value and the middle point A is in a signal region and, on the other hand, respective signal intensities of twenty-six lattice points adjacent to the middle point A are equal to or lower than the threshold value and the lattice points are in a no-signal area as shown in FIG. 8, replacing the twenty-six lattice point of the no-signal region with the signal intensity of the middle point A.

In addition, region growing according to the 6-point method is processing for, when a signal intensity of a middle point A of a lattice is equal to or larger than a threshold value and the middle point A is in a signal region and, on the other hand, respective signal intensity of six lattice points adjacent to the middle point A are equal to or lower than the threshold value and the lattice points are in a no-signal area as shown in FIG. 9, replacing the six lattice point of the no-signal region with the signal intensity of the middle point A.

FIG. 10 is a diagram showing an example of region growing applied to a no-signal region outside the patient P of three-dimensional sensitivity map data by the magnetic resonance imaging apparatus 20 shown in FIG. 1.

As shown in (a) in FIG. 10, three-dimensional sensitivity map data after linear interpolation has a no-signal region D1 outside the patient P and a signal region D2 in the patient P. As a result of applying region growing to the no-signal region D1 outside the patient P1, as shown in (b) in FIG. 10, the no-signal region D1 outside the patient P is replaced with the signal region D2 and interpolated, whereby the entire region changes to the signal region D2. Then, three-dimensional sensitivity map data is created over an entire region of each slice.

On the other hand, depending on arrangement of channels of the phased-array coil 24b, a sensitivity distribution of the phased-array coil 24b may not be uniform in the Z-axis direction (the slice direction) of the device coordinate system.

Thus, in step S28, the slice direction weighting unit 44h corrects the three-dimensional sensitivity map data by weighting the three-dimensional sensitivity map data in the slice direction. The slice direction weighting unit 44h can carry out weighting in the slice direction by calculating an inverse Y of a correction coefficient with, for example, expression (1) and multiplying the three-dimensional sensitivity map data by a correction coefficient 1/Y.

$$Y=1 \text{ if } Z<B \quad (1)$$

$$Y=A\times(Z-B)^2+1 \text{ if } Z\geq B$$

where Z is a slice position in the Z direction, A is a coefficient, and B is an offset amount.

FIG. 11 is a diagram in which the correction coefficient 1/Y in carrying out weighting in the slice direction of the three-dimensional sensitivity map data is plotted by the magnetic resonance imaging apparatus 20 shown in FIG. 1.

In FIG. 11, a vertical axis indicates the correction coefficient 1/Y and a horizontal axis indicates the slice position Z in the Z direction. A solid line in FIG. 11 is a curve indicating the correction coefficient 1/Y at the time when the coefficient A is set to −20 and the offset amount B is set to 0.

When the slice position Z in the Z direction is smaller than the offset amount B of 0 set in advance, the correction coefficient 1/Y is set to 1 and interpolation for the three-dimensional map data is not performed.

On the other hand, when the slice position Z in the Z direction is equal to or more than the offset amount B of 0 set in advance, the correction coefficient 1/Y is calculated by an equation that is converted into a function using a quadratic. Interpolation is carried out by multiplying the three-dimensional map data by the obtained correction coefficient 1/Y.

However, instead of using the quadratic for the equation for the inverse Y of the correction coefficient, it is possible to approximate the equation for the inverse Y using an arbitrary function.

Next, in step S29, the three-dimensional smoothing processing unit 44i applies a 3D smoothing filter of a required intensity to the three-dimensional sensitivity map data according to circumstances. As a result, it is possible to generate a final three-dimensional sensitivity map data, in which there is no region with an extremely larger value locally and continuity is improved in all of the RO direction, the PE direction, and the SL direction, accurately.

In step S30, the three-dimensional sensitivity map data generated by the sensitivity distribution estimating unit 44 is written and stored in the sensitivity map database 45.

Next, in step S12 in FIG. 4, a sequence for image acquisition is given to the sequence controller control unit 38 by the main scan executing unit 37 and main scan is executed. Then, raw data is collected and image data is obtained by image reconstruction processing of the image reconstructing unit 40.

Next, in step S13, luminance of the image data obtained in the main scan is corrected according to the three-dimensional sensitivity map data. Therefore, according to conditions such as an imaging condition including an imaging sectional direction and spatial resolution, a data collection condition, and an image reconstruction condition in the main scan, the image data correcting unit 46 slices corresponding three-dimensional sensitivity map data from the sensitivity map database 45.

Then, the image data correcting unit 46 corrects luminance of the image data using the sliced three-dimensional sensitivity map data. In this case, the sliced three-dimensional sensitivity map data may be normalized as required.

As a result, influence of non-uniformity of signal intensities due to fluctuation in sensitivities of the phased-array coil 24b is controlled, which makes it possible to obtain image data with improved luminance.

According to the magnetic resonance imaging apparatus 20 described above, it is possible to estimate a sensitivity distribution of the phased-array coil 24b more accurately on the basis of image data obtained by implementation of sensitivity pre-scan and correct luminance of image data obtained by implementation of main scan more satisfactorily on the basis of the obtained sensitivity distribution of the phased-array coil 24b.

In the method of correcting luminance of image data by the conventional magnetic resonance imaging apparatus 1, even when luminance of image data cannot be corrected sufficiently, for example, when no-signal regions such as lungs are included in an imaging region of sensitivity pre-scan, when a gap occurs between a shape of the patient P imaged by the phased-array coil 24b and a shape of the patient P imaged by the WB coil 24a at the time of imaging of the sensitivity pre-scan as a shape of an internal organ can change regardless of an intention of the patient P, or when non-uniformity of signal intensities occurs in the Z-axis direction of the device coordinate system because of arrangement characteristics of the respective channels of the phased-array coil 24b, according to the magnetic resonance imaging apparatus 20, it is possible to correct luminance of image data satisfactorily.

Figure 12:
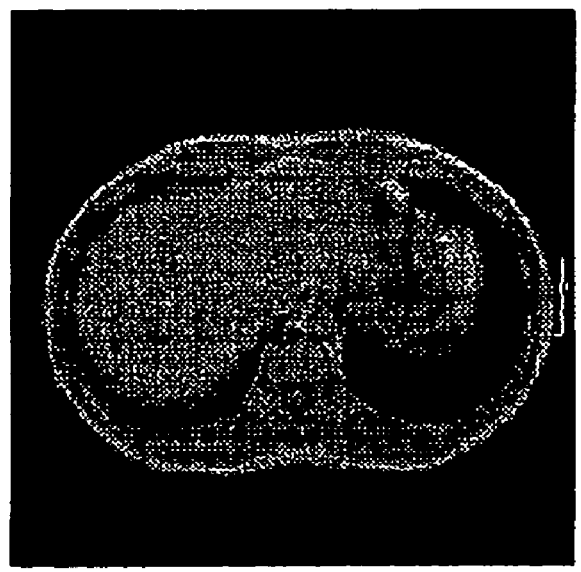
FIG. 12 is a tomographic image of a patient after luminance correction obtained by the magnetic resonance imaging apparatus shown in FIG. 1.
Figure 13:
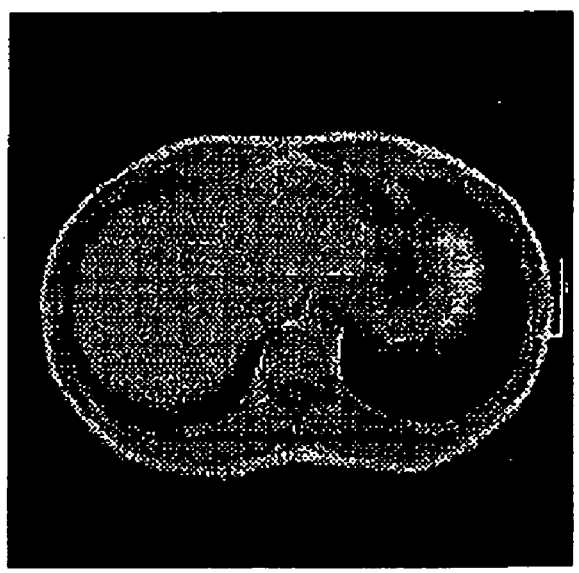
FIG. 13 is a tomographic image of a patient after luminance correction obtained by a conventional magnetic resonance imaging apparatus.

FIG. 12 is a tomographic image of the patient P after luminance correction obtained by the magnetic resonance imaging apparatus 20 shown in FIG. 1. FIG. 13 is a tomographic image of the patient P after luminance correction obtained by the conventional magnetic resonance imaging apparatus 20.

According to FIG. 13, it is seen that a gap occurs between a shape of the patient P imaged by the phased-array coil 24 and a shape of the patient P imaged by the WB coil 24a at the time of imaging of sensitivity pre-scan and, as a result, luminance of image data is not corrected sufficiently.

On the other hand, according to FIG. 12, it can be confirmed that, since three-dimensional sensitivity map data with improved continuity can be generated accurately by region reduction of a WB reconstructed image and a PAC reconstructed image even if a gap occurs between a shape of the patient P imaged by the phased-array coil 24b and a shape of the patient P imaged by the WB coil 24a, luminance of image data can be corrected sufficiently.

Note that, in the magnetic resonance imaging apparatus 20 described above, a part of data processing does not have to be performed. Accordingly, a part of the components does not have to be provided. In addition, a single coil may be used instead of the phased-array coil 24b.

Figure 14:
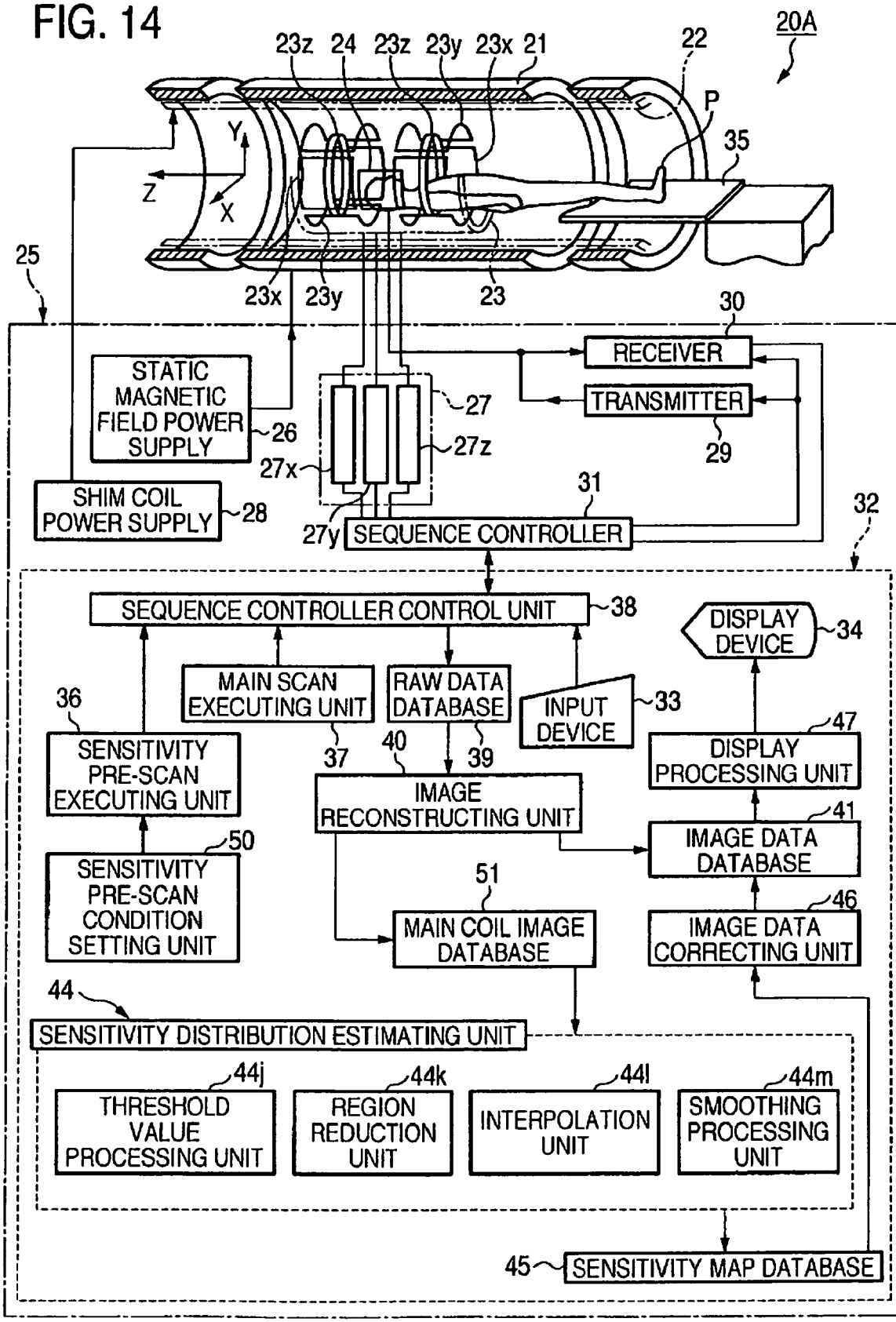
FIG. 14 is a functional block diagram showing a second embodiment of the magnetic resonance imaging apparatus according to the invention.

FIG. 14 is a block diagram showing a second embodiment of the magnetic resonance imaging apparatus according to the invention.

A magnetic resonance imaging apparatus 20A shown in FIG. 14 is different from the magnetic resonance imaging apparatus 20 shown in FIG. 1 in detailed structures of the RF coil 24 and the receiver 30 and functions of the computer 32. Since the structures of the other components and the actions are not substantially different from those in the magnetic resonance imaging apparatus 20 shown in FIG. 1, the identical components are denoted by the same reference numerals and signs and are not explained.

Figure 15:
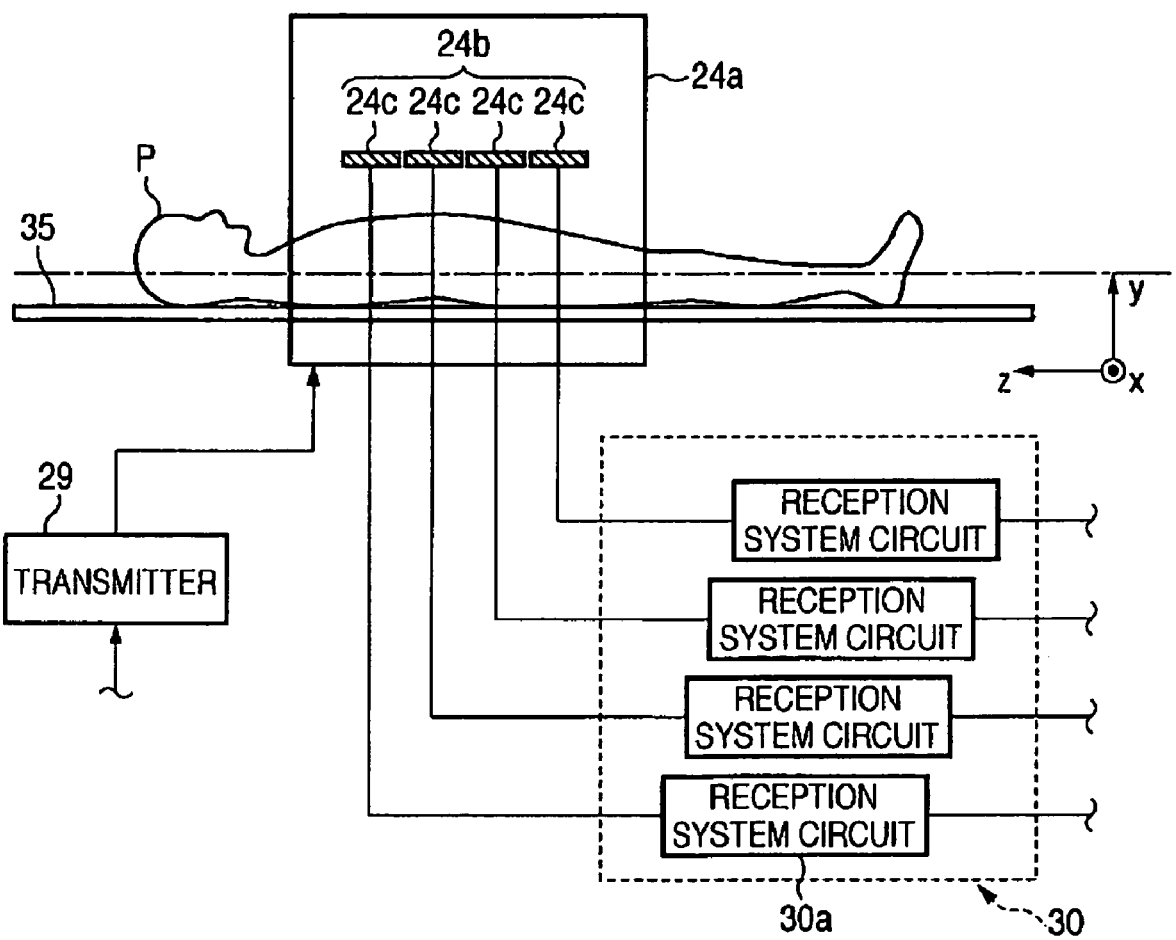
FIG. 15 is a detailed diagram showing an example of an RF coil and a receiver shown in FIG. 14.

FIG. 15 is a detailed diagram showing an example of the RF coil 24 and the receiver 30 shown in FIG. 14.

The RF coil 24 includes the WB coil 24a for transmission of a radiofrequency signal and the phased-array coil 24b serving as a main coil that is a coil for receiving an NMR signal. The phased-array coil 24b includes the plural surface coils 24c.

On the other hand, the receiver 30 includes the plural reception system circuits 30a. The respective surface coils 24c are connected to the respective reception system circuits 30a of the receiver 30 individually. The WB coil 24a is connected to the transmitter 29. However, the WB coil 24a may be connected to the reception system circuits 30a of the receiver 30.

Note that an example of arrangement of the WB coil 24a and the phased-array coil 24b is the same as that shown in FIG. 3.

The respective surface coils 24c of the phased-array coil 24b are arranged symmetrically around a Z-axis, that is, for example, a periphery of a section L including a specific region of interest of the patient P. The WB coil 24a is provided on the outer side of the phased-array coil 24b. The RF coil 24 is constituted such that the RF coil 24 can transmit a radiofrequency signal to the patient P using the WB coil 24a and, on the other hand, receive an NMR signal from the section L including the specific region of interest in multi-channel using the respective surface coils 24c of the phased-array coil 24b and give the NMR signal to the receiver 30.

As programs are read and executed in the computer 32, the computer 32 functions as the sensitivity pre-scan executing unit 36, a sensitivity pre-scan condition setting unit 50, the main scan executing unit 37, the sequence controller control unit 38, the raw data database 39, the image reconstructing unit 40, the image database 41, a main coil image database 51, the sensitivity distribution estimating unit 44, the sensitivity map database 45, the image data correcting unit 46, and the display processing unit 47. However, the computer 32 may be constituted by providing specific circuits regardless of the programs.

The sensitivity pre-scan executing unit 36 has a function of generating a sequence in executing sensitivity pre-scan for obtaining three-dimensional sensitivity map data that is a sensitivity distribution of the phased-array coil 24b (a sequence for sensitivity estimation) on the basis of an imaging condition received from the sensitivity pre-scan condition setting unit 50 and a function of giving the generated sequence for sensitivity estimation to the sequence controller control unit 38 to thereby cause the sequence controller control unit 38 to execute the sensitivity pre-scan.

The sensitivity pre-scan condition setting unit 50 has a function of setting an imaging condition in sensitivity pre-scan to be sufficiently low for obtaining three-dimensional sensitivity map data and a function of giving the set imaging condition for sensitivity pre-scan to the sensitivity pre-scan executing unit 36.

The main scan executing unit 37 has a function of giving various sequences in executing main scan for acquiring image data to the sequence controller control unit 38 to thereby cause the sequence controller control unit 38 to execute the main scan.

The sequence controller control unit 38 has a function of giving a required sequence among sequences received from the sensitivity pre-scan executing unit 36 and the main scan executing unit 37 to the sequence controller 31 on the basis of information from the input device 33 or the other components to thereby cause the sequence controller 31 to execute sensitivity pre-scan or main scan. The sequence controller control unit 38 also has a function of receiving raw data of the respective surface coils 24c of the phased-array coil 24b, which are collected by execution of the sensitivity pre-scan or the main scan, from the sequence controller 31 and arranging the raw data in the K space (the Fourier space) formed in the raw data database 39.

Therefore, the respective raw data of each of the surface coil 24c generated in the receiver 30 are stored in the raw data database 39. In other words, the raw data are arranged in the K space formed in the raw data database 39.

The image reconstructing unit 40 has a function of applying image reconstruction processing such as the Fourier transformation (FT) to the raw data, which are arranged in the K space of the raw data database 39 by the execution of the main scan, to thereby reconstruct image data of the patient P and a function of writing the reconstructed image data in the image data database 41.

The image reconstructing unit 40 also has a function of applying reconstruction processing, which is performed by the same method as the reconstruction processing for the raw data obtained by execution of the main scan, to the raw data, which are arranged in the K space of the raw data database 39 by execution of the sensitivity pre-scan, to thereby reconstruct the image data of the patient P as main coil image data and a function of writing the reconstructed main coil image data in the main coil image database 51.

The sensitivity distribution estimating unit 44 has a function of using the main coil image data stored in the main coil image database 51 as data for sensitivity estimation, which is original data of sensitivity correction data, to thereby create three-dimensional sensitivity map data of the phased-array coil 24b and a function of writing the created three-dimensional sensitivity map data in the sensitivity map database 45. Therefore, the sensitivity distribution estimating unit 44 includes a threshold value processing unit 44j, a region reduction unit 44k, an interpolation unit 44l, and a smoothing processing unit 44m.

The threshold value processing unit 44*j* has a function of applying threshold value processing to the main coil image data, that is, a function of masking data of sections where a signal intensity of the main coil image data is equal to or lower than a threshold value set in advance.

The region reduction unit 44*k* has a function of reducing a region of the main coil image data used for estimating a sensitivity distribution and excluding sections with the small signal intensity near a mask region from data for creating three-dimensional sensitivity map data.

The interpolation unit 44*l* has a function of estimating three-dimensional sensitivity map data in a masked no-signal region after the region reducing processing for the main coil image data and extrapolating or interpolating the three-dimensional sensitivity map data to thereby interpolate the main coil image data for estimating a sensitivity distribution.

The smoothing processing unit 44*m* has a function of applying smoothing processing to the main coil image data for estimating a sensitivity distribution to thereby create final three-dimensional sensitivity map data.

The image data correcting unit 46 has a function of slicing and extracting three-dimensional sensitivity map data corresponding to image data acquisition conditions such as an imaging condition, a data collection condition, and an image reconstruction condition in main scan from the three-dimensional sensitivity map data stored in the sensitivity map database 45 and a function of correcting a signal intensity of the image data stored in the image data database 41 according to execution of the main scan using the extracted three-dimensional sensitivity map data.

The display processing unit 47 has a function of giving the image data stored in the image data database 41 to the display device 34 to cause the display device 34 to display the image data.

The magnetic resonance imaging apparatus 20A having the structure described above functions as a whole, with the respective components, as a scan executing unit that executes sensitivity pre-scan to generate sensitivity correction data of a reception coil in imaging of main scan using the reception coil in imaging as a reception coil and a sensitivity correction data generating unit that generates sensitivity correction data with only data, which is acquired by the reception coil in imaging in the sensitivity pre-scan, as original data.

Figure 16:
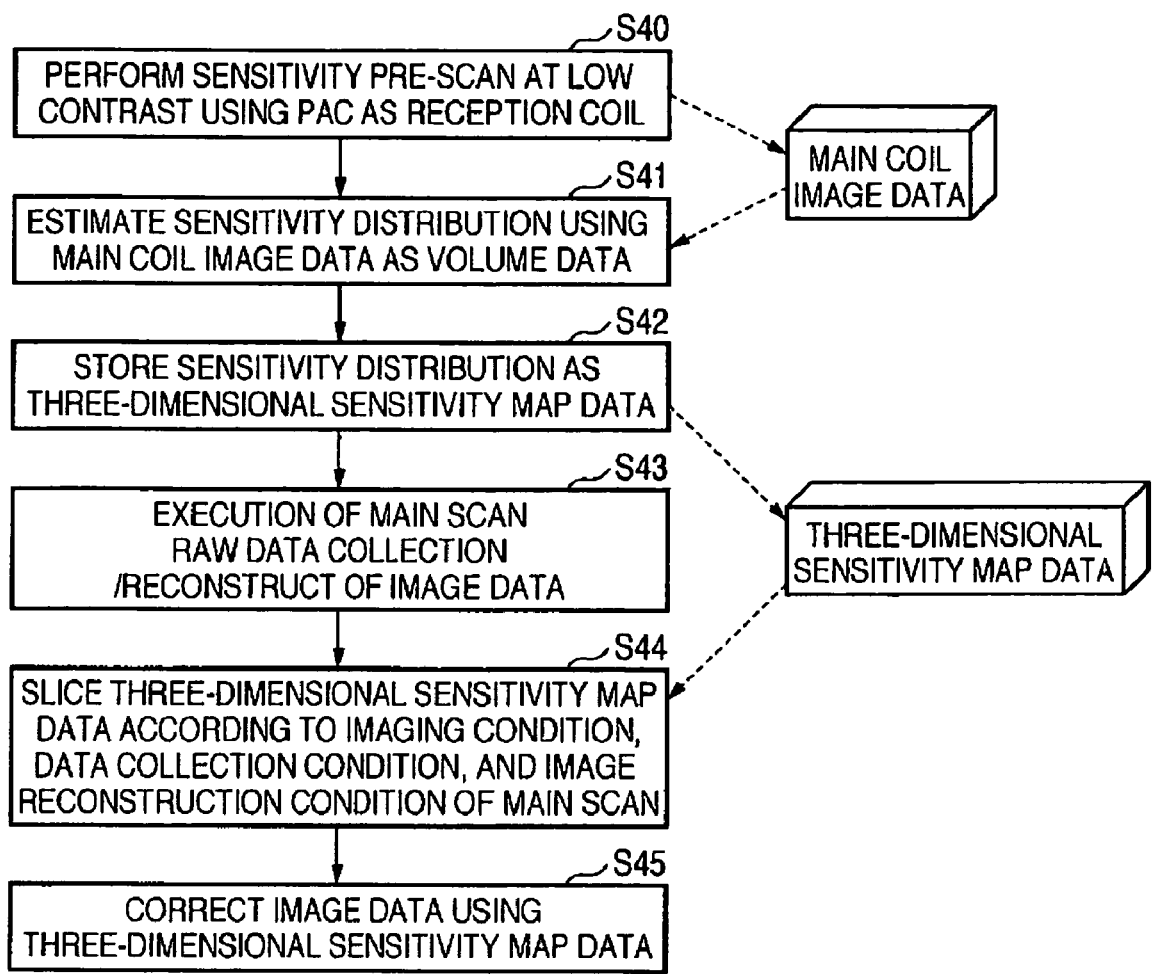
FIG. 16 is a flowchart showing a procedure in imaging a tomographic image of a patient using the magnetic resonance imaging apparatus shown in FIG. 14.

FIG. 16 is a flowchart showing a procedure in imaging a tomographic image of the patient P using the magnetic resonance imaging apparatus 20A shown in FIG. 14. Reference signs S attached with numbers in the figure denote respective steps of the flowchart.

First, in step S40, sensitivity pre-scan is executed. The sensitivity pre-scan condition setting unit 50 sets an imaging condition in the sensitivity pre-scan and gives a sequence for sensitivity estimation to the sensitivity pre-scan executing unit 36. Here, the imaging condition in the sensitivity pre-scan are set such that an image, which is reconstructed to be obtained for creating three-dimensional sensitivity map data, has a sufficiently low contrast.

As the imaging conditions for obtaining a low contrast, for example, it is possible to set a condition in imaging a proton density enhanced image, which is less affected by both T1 (longitudinal relaxation time) and T2 (transverse relaxation time), by extending repetition time (TR) and reducing echo time (TE) or an imaging condition close to the condition.

As the sequence for sensitivity estimation for execution of sensitivity pre-scan, it is advisable to use, for example, a fast field echo (FFE) system sequence in which TE is set rather short at about 1 to 5 ms and a flip angle is reduced to about 5 to 10 degrees. Moreover, if TR is set to about 200 ms, it is possible to collect main coil image data in twenty or more slices. Thus, it is possible to acquire main coil image data of an entire volume, on which sensitivity of the surface coil 24*c* is reflected, required for creating three-dimensional sensitivity map data.

On the other hand, imaging in the sensitivity pre-scan may be 3D imaging rather than 2D multi-slice imaging. As a sequence for sensitivity estimation of the 3D imaging, it is possible to use, for example, an FFE system sequence in which TE is set rather short at about 1 to 5 ms and a flip angle is reduced to about 5 degrees or less. Moreover, if TR is set to about 10 ms, it is possible to acquire necessary main coil image data with imaging time equivalent to imaging time in the 2D imaging.

Then, the sequence for sensitivity estimation is given to the sequence controller control unit 38 by the sensitivity pre-scan executing unit 36. Sensitivity pre-scan is executed using only the phased-array coil 24*b*, which is a reception coil in main scan (a main coil), as a reception coil. In other words, sensitivity pre-scan for obtaining sensitivity map data of the phased-array coil 24*b* is executed prior to main scan for acquiring image data.

The patient P is set on the bed 35 in advance and an electric current is supplied from the static magnetic field power supply 26 to the magnet for static magnetic field 21 to form a static magnetic field in an imaging region. In addition, an electric current is supplied from the shim coil power supply 28 to the shim coil 22 to uniformalize the static magnetic field formed in the imaging region.

Next, an operation command is given to the sequence controller control unit 38 from the input device 33. Therefore, the sequence controller control unit 38 gives the sequence for sensitivity estimation to the sequence controller 31. The sequence controller 31 drives the gradient magnetic power supply 27, the transmitter 29, and the receiver 30 in accordance with the sequence for sensitivity estimation to thereby form the X-axis gradient magnetic field Gx, the Y-axis gradient magnetic field Gy, and the Z-axis gradient magnetic field Gz in the imaging region where the patient P is set and generate a radiofrequency signal.

In this case, the X-axis gradient magnetic field Gx, the Y-axis gradient magnetic field Gy, and the Z-axis gradient magnetic field Gz formed by the gradient magnetic field coil are used mainly as a phase encoding (PE) gradient magnetic field, a readout (RO) gradient magnetic field, and a slice encoding (SE) gradient magnetic field, respectively. Consequently, regularity appears in a rotating direction of a nuclear spin in the patient P. An X coordinate and a Y coordinate, which are two-dimensional position information in a slice formed in the Z-axis direction by the SE gradient magnetic field, are transformed into an amount of phase change and an amount of frequency change of the nuclear spin in the patient P by the PE gradient magnetic field and the RO gradient magnetic field, respectively.

Then, a radiofrequency signal is given to the WB coil 24*a* of the RF coil 24 from the transmitter 29 according to the sequence for sensitivity estimation and the radiofrequency signal is transmitted from the WB coil 24*a* to the patient P. Moreover, an NMR signal, which is generated by nuclear magnetic resonance of an atomic nucleus included in a slice corresponding to a frequency of the radiofrequency signal in the patient P, is received in multi-channel by the respective surface coils 24c of the phased-array coil 24b which is the main coil of the RF coil 24 and given to the receiver 30.

Note that the WB coil 24a is used only for transmission of a radiofrequency signal and is not used for reception of the radiofrequency signal.

The receiver 30 receives NMR signals from the respective surface coils 24c of the phased-array coil 24b and executes various kinds of signal processing such as pre-amplification, intermediate frequency transformation, phase detection, low frequency amplification, and filtering. Moreover, the receiver 30 subjects the NMR signals to A/D conversion to thereby generate raw data that are NMR signals of digital data. The receiver 30 gives the generated raw data to the sequence controller 31.

The sequence controller 31 gives the raw data received from the receiver 30 to the sequence controller control unit 38. The sequence controller control unit 38 arranges the raw data in the K space formed in the raw data database 39. Moreover, the image reconstructing unit 40 executes the Fourier transformation (FT) on the obtained raw data arranged in the K space of the raw data database 39 to thereby reconstruct volume data, which is three-dimensional image data of the patient P, as main coil image data. The image reconstructing unit 40 writes the volume data in the main coil image database 51 as data for sensitivity estimation for obtaining three-dimensional sensitivity map data of the phased-array coil 24b.

In this case, a reconstruction processing method for raw data collected by the sensitivity pre-scan is the same as a reconstruction processing method in the main scan. As the reconstruction processing method using the phased-array coil 24b in the main scan, there are Sum of Square processing (SoS processing) for calculating a root sum square of image data obtained by the respective surface coils 24c and a reconstruction processing method for calculating a sum of signal intensity absolute values of image data obtained by the respective surface coils 24c.

Next, in step S41, the sensitivity distribution estimating unit 44 estimates a sensitivity distribution by using the main coil image data serving as volume data stored in the main coil image database 51 as data for sensitivity estimation.

Figure 17:
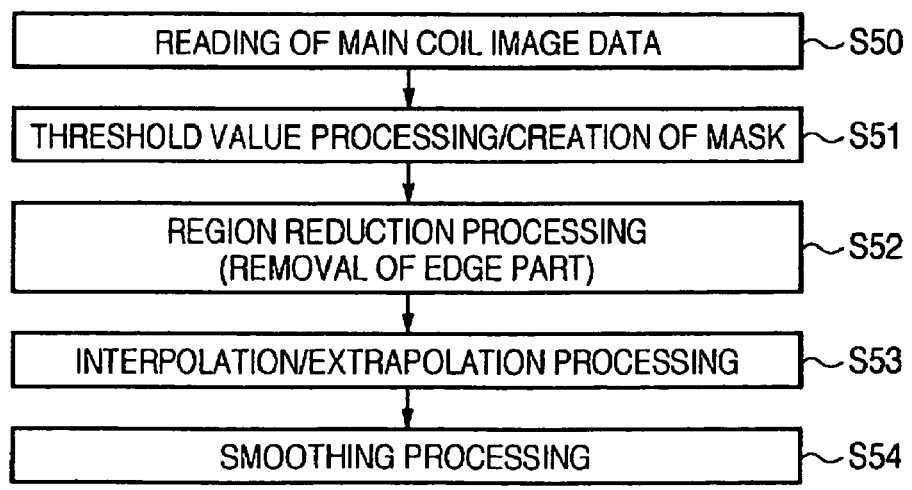
FIG. 17 is a flowchart showing an example of a detailed procedure in estimating a sensitivity distribution of a phased-array coil in the flowchart shown in FIG. 16.

FIG. 17 is a flowchart showing an example of a detailed procedure in estimating a sensitivity distribution of the phased-array coil 24b in the flowchart shown in FIG. 16. Reference signs S attached with numbers in the figure denote respective steps of the flowchart.

First, in step S50, main coil image data is read into the sensitivity distribution estimating unit 44 from the main coil image database 51.

Figure 18:
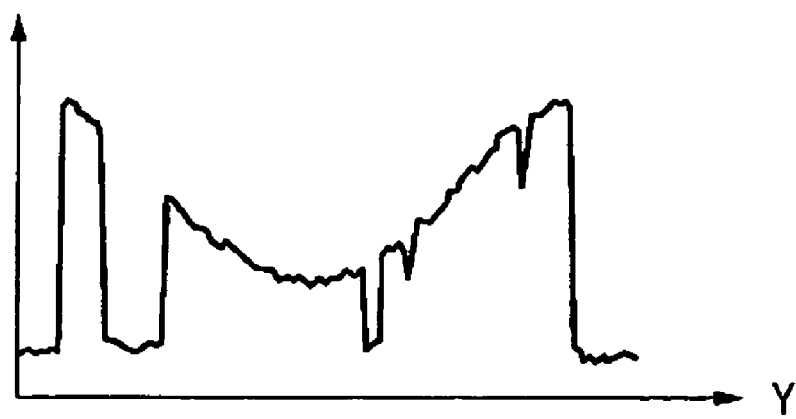
FIG. 18 is a diagram showing a signal intensity distribution of main coil image data obtained under an imaging condition for obtaining a low contrast.
Figure 19:
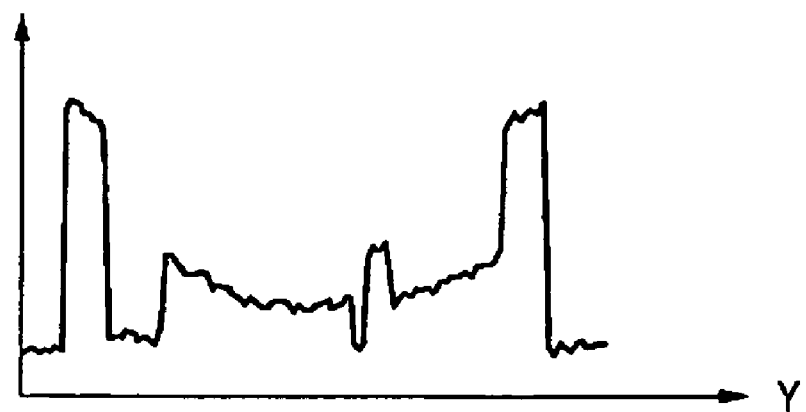
FIG. 19 is a diagram showing a signal intensity distribution of main coil image data obtained under an imaging condition for obtaining a general contrast.

FIG. 18 is a diagram showing a signal intensity distribution of main coil image data obtained under an imaging condition for obtaining a low contrast. FIG. 19 is a diagram showing a signal intensity distribution of main coil image data obtained under an imaging condition for obtaining a general contrast.

In FIGS. 18 and 19, a vertical axis indicates a signal value of main coil image data and a horizontal axis indicates a position in the section L direction including a region of interest (ROI) in FIG. 3.

As shown in FIG. 19, in the main coil image data obtained under the imaging condition for obtaining a general contrast, influence due to a difference of contrasts is not sufficiently small. Thus, it is difficult to use the main coil image data as data for sensitivity estimation of the phased-array coil 24b directly.

On the other hand, as shown in FIG. 18, in the main coil image data obtained under the imaging condition for obtaining a low contrast, influence due to a difference of contrasts is sufficiently small. Thus, it is possible to reduce an error even if the main coil image data is used as data for sensitivity estimation of the phased-array coil 24b directly.

Note that, here, the main coil image data is described as one-dimensional data on the straight line L including the ROI. However, actually, two-dimensional or three-dimensional imaging is carried out and two-dimensional or three-dimensional main coil image data is used as data for sensitivity estimation to be an object of various kinds of processing for creation of three-dimensional sensitivity map data.

Thus, the main coil image data obtained under the imaging condition for obtaining a low contrast is used as data for sensitivity estimation to carry out the various kinds of processing for creating three-dimensional sensitivity map data. The processing will be explained in comparison with a conventional method of creating sensitivity map data.

FIG. 20 is a diagram showing data that is generated when three-dimensional sensitivity map data is created by the conventional magnetic resonance imaging apparatus 1.

In the conventional magnetic resonance imaging apparatus 1, sensitivity pre-scan is executed using both the phased-array coil 24b and the WB coil 24a as reception coils. Thus, main coil image data obtained by the phased-array coil 24b shown in (a) in FIG. 20 and WB coil image data obtained by the WB coil 24a shown in (b) in FIG. 20 are acquired and both the data are used as data for sensitivity estimation. Then, threshold value is applied to both the main coil image data and the WB coil image data through comparison with threshold values $\epsilon$ and $\epsilon'$ set in advance. Sections of a no-signal region are excluded from the data for sensitivity estimation.

Moreover, in the data region for sensitivity estimation D1 after the threshold value processing, the main coil image data is divided by the WB coil image data, whereby three-dimensional sensitivity map data, which is made dimensionless, shown in (c) in FIG. 20 is created. Then, interpolation processing such as extrapolation and interpolation is applied over the entire region to create three-dimensional sensitivity map data shown in (d) in FIG. 20.

On the other hand, in the magnetic resonance imaging apparatus 20A shown in FIG. 14, sensitivity pre-scan is executed using only the phased-array coil 24b as a reception coil.

Figure 21A:
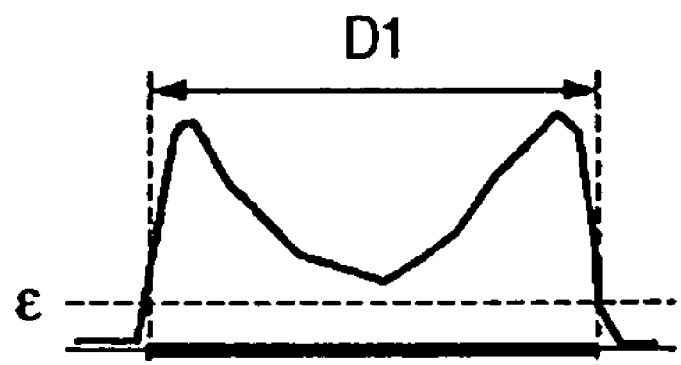
FIG. 21 is a diagram for explaining problems in generating three-dimensional sensitivity map data using the magnetic resonance imaging apparatus shown in FIG. 14.
Figure 21B:
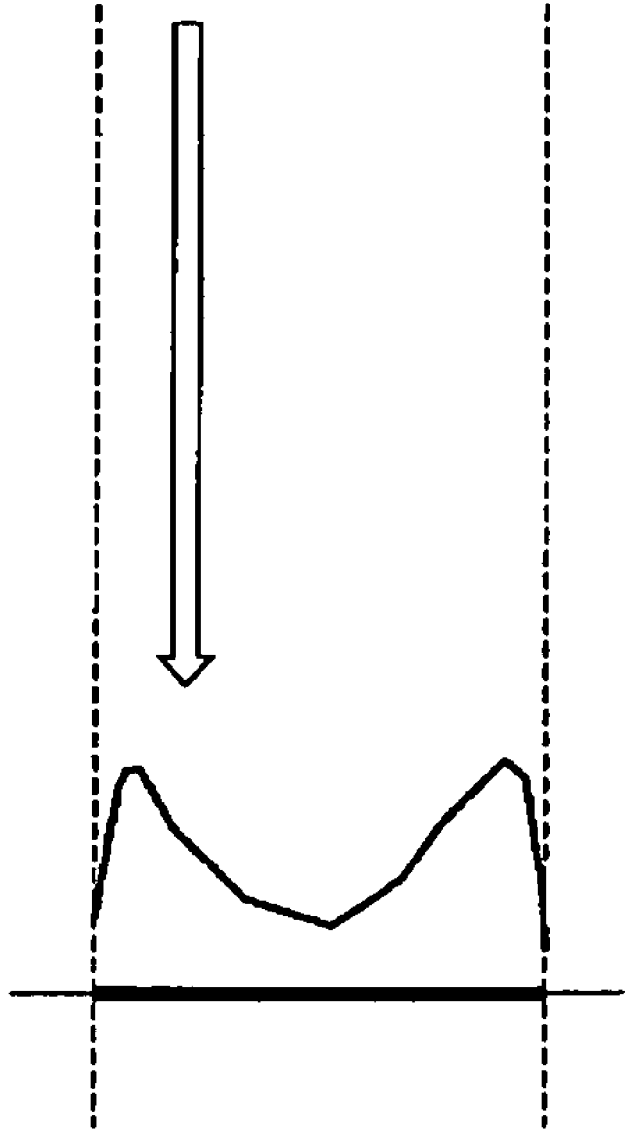
Figure 22A:
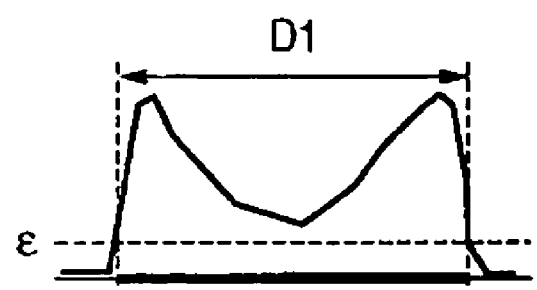
FIG. 22 is a diagram showing data that is generated when three-dimensional sensitivity map data is generated by the magnetic resonance imaging apparatus according to a procedure avoiding the problems shown in FIG. 21.
Figure 22B:
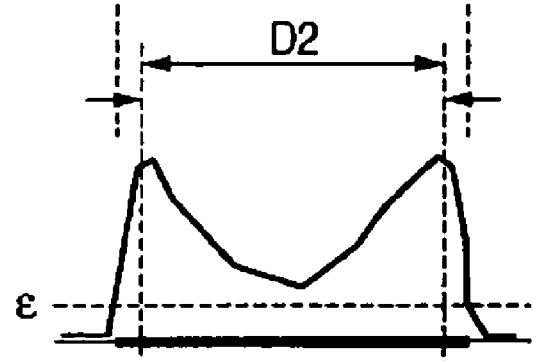
Figure 22C:
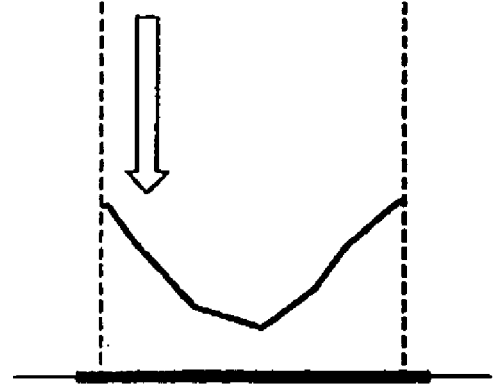
Figure 22D:
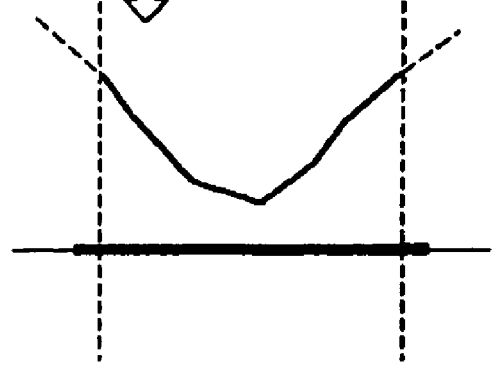

FIG. 21 is a diagram for explaining problems in generating three-dimensional sensitivity map data using the magnetic resonance imaging apparatus 20A shown in FIG. 14. FIG. 22 is a diagram showing data that is generated when three-dimensional sensitivity map data is generated by the magnetic resonance imaging apparatus 20A according to a procedure avoiding the problems shown in FIG. 21.

In step S51 in FIG. 17, threshold value processing is applied to the main coil image data by the threshold value processing unit 44j. As shown in (a) in FIG. 21 and (a) in FIG. 22, sections of the main coil image data where a signal intensity is equal to or lower than the threshold value $\epsilon$ set in advance are masked and sections of a no-signal region such as a region outside the patient P and lung fields are excluded from the data for sensitivity estimation.

Then, the main coil image data with a low contrast of a proton density enhanced image can be used as data for sensitivity estimation directly without being divided by the WB coil image data in the data region for sensitivity estimation D1 after the threshold value processing. However, only with the threshold value processing, influence of sections with a low signal intensity near no-signal regions such as the region outside the patient P and the lung fields is not cancelled as shown in (b) in FIG. 21. A value of the data for sensitivity estimation also decreases. Thus, it is difficult to create more accurate three-dimensional sensitivity map data.

Thus, in step S52, reduction processing for a region used as the data for sensitivity estimation is carried out by the region reduction unit 44k. As shown in (b) in FIG. 22, a phenomenon in which, in general, a signal intensity is small compared with other sections occurs near a boundary with the mask region of the data region for sensitivity estimation D1. Thus, a region of an edge part, where a signal intensity is small, is excluded by the reduction processing for the data region for sensitivity estimation D1.

Then, in step S53, as shown in (c) in FIG. 22, a signal intensity of main coil image data in a new data region for sensitivity estimation D2 after the region reduction processing is regarded as three-dimensional map data. Moreover, three-dimensional sensitivity map data in a masked no-signal region after the region reduction processing is estimated by interpolation processing such as extrapolation and interpolation by the interpolation unit 44l. Three-dimensional sensitivity map data over the entire region shown in (d) in FIG. 22 is created.

Next, in step S54, smoothing processing is applied to the three-dimensional sensitivity map data over the entire region after interpolation by performing fitting such as orthogonal function expansion. As a result, final three-dimensional sensitivity map data having more continuity is created.

Then, in step S42 in FIG. 16, the three-dimensional sensitivity map data of the phased-array coil 24b is stored in the sensitivity map database 45.

Next, in step S43, a sequence for image acquisition is given to the sequence controller control unit 38 by the main scan executing unit 37 and main scan is executed using the phased-array coil 24b as a reception coil. Then, raw data is collected and image data is obtained by image reconstruction processing of the image reconstructing unit 40.

Next, in step S44, according to conditions such as an imaging condition including an imaging sectional direction and spatial resolution, a data collection condition, and an image reconstruction condition in the main scan, the image data correcting unit 46 slices corresponding three-dimensional sensitivity map data from the sensitivity map database 45.

Then, in step S45, the image data correcting unit 46 corrects the image data using the sliced three-dimensional sensitivity map data. In other words, correction processing for multiplying respective signal intensities of the image data by an inverse of the three-dimensional sensitivity map data is executed. In this case, general error processing for correction of image data such as processing to make the three-dimensional sensitivity map data to non-zero or case classification processing at the time when the three-dimensional sensitivity map data is zero is performed according to circumstances.

As a result, influence of non-uniformity of signal intensities due to fluctuation in sensitivities of the phased-array coil 24b is controlled and image data with an improved quality can be obtained.

According to the magnetic resonance imaging apparatus 20A described above, even if there is fluctuation in sensitivities of a reception coil as in the case of imaging that uses the phased-array coil 24b constituted by plural surface coils, since the WB coil 24a is not used as a reception coil in the sensitivity pre-scan, it is possible to correct unevenness in signal intensities of image data in a shorter time regardless of an imaging condition such as an image type. It is also possible to obtain an image with high diagnostic ability over an entire imaging field of view at sufficient accuracy more easily than in the past.

For example, in imaging for 48×48 matrix under the imaging condition of TR 200 ms, conventionally, imaging time of 19.2 seconds is required in order to acquire data of both the WB coil 24a and the phased-array coil 24b in sensitivity pre-scan. However, according to the magnetic resonance imaging apparatus 20A, it is possible to acquire all main coil image data, which are necessary for creating three-dimensional sensitivity map data, with breath-holding imaging 9.6 seconds that is half the imaging time. Thus, it is possible to reduce a burden on a patient through reduction of the imaging time.

Moreover, in this method, imaging by the WB coil 24a is unnecessary. Thus, it is possible to execute imaging even if decoupling between the WB coil 24a and the phased-array coil 24b is insufficient. It is also possible to prevent occurrence of an error such as misregistration of data between the WB coil 24a and the phased-array coil 24b.

Figure 23:
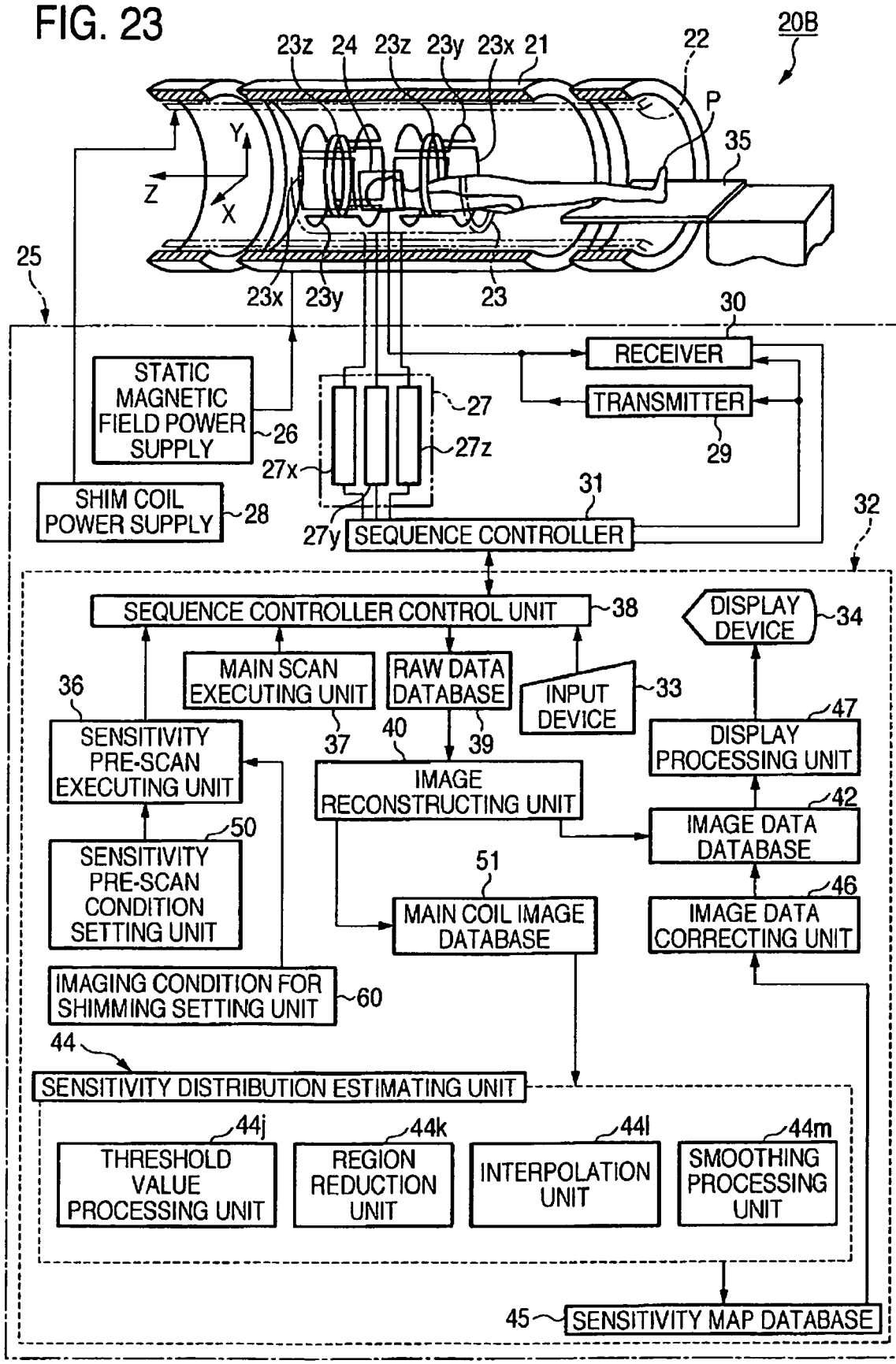
FIG. 23 is a functional block diagram showing a third embodiment of the magnetic resonance imaging apparatus according to the invention.
Figure 24:
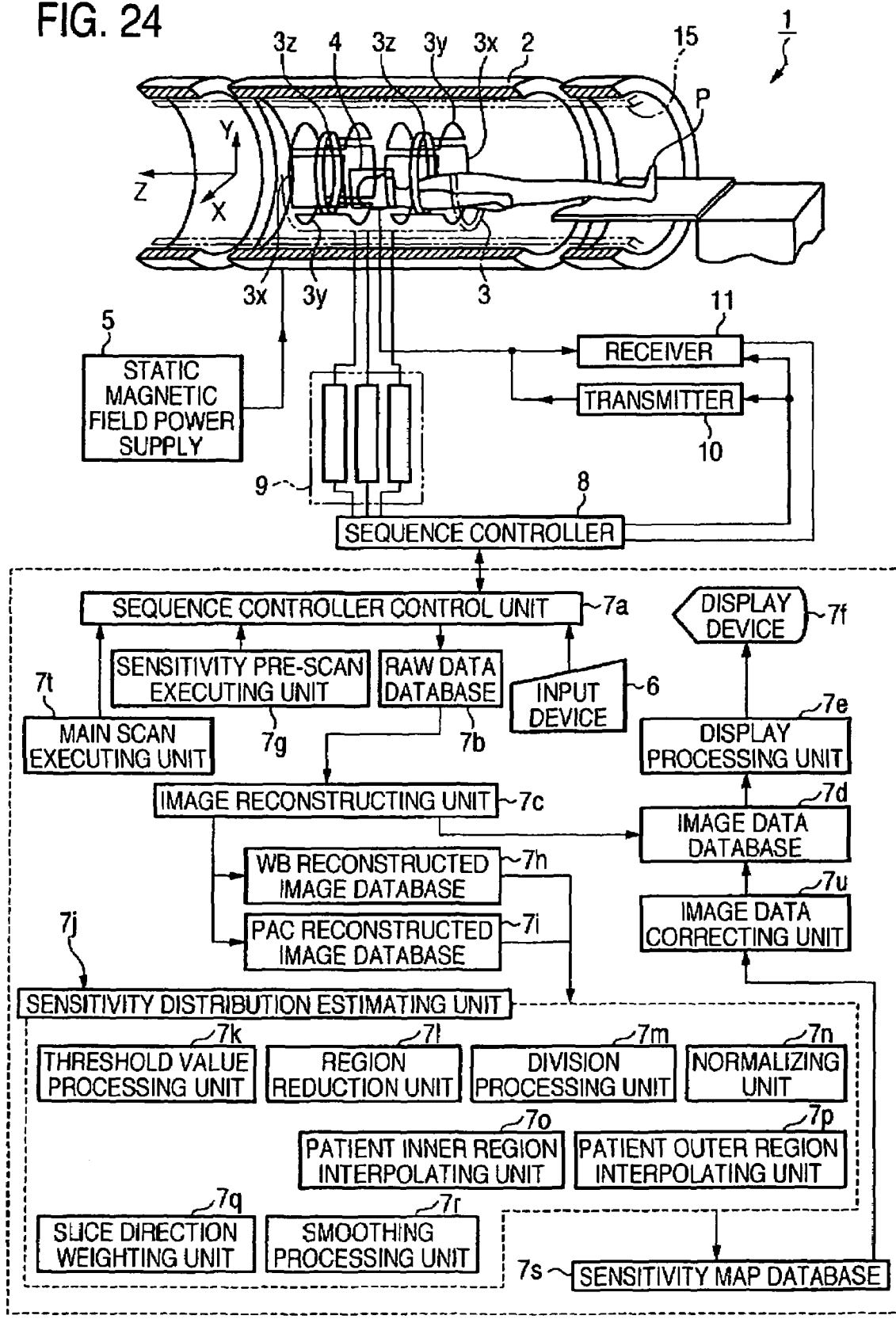
FIG. 24 is a functional block diagram of a conventional magnetic resonance imaging apparatus.
Figure 25:
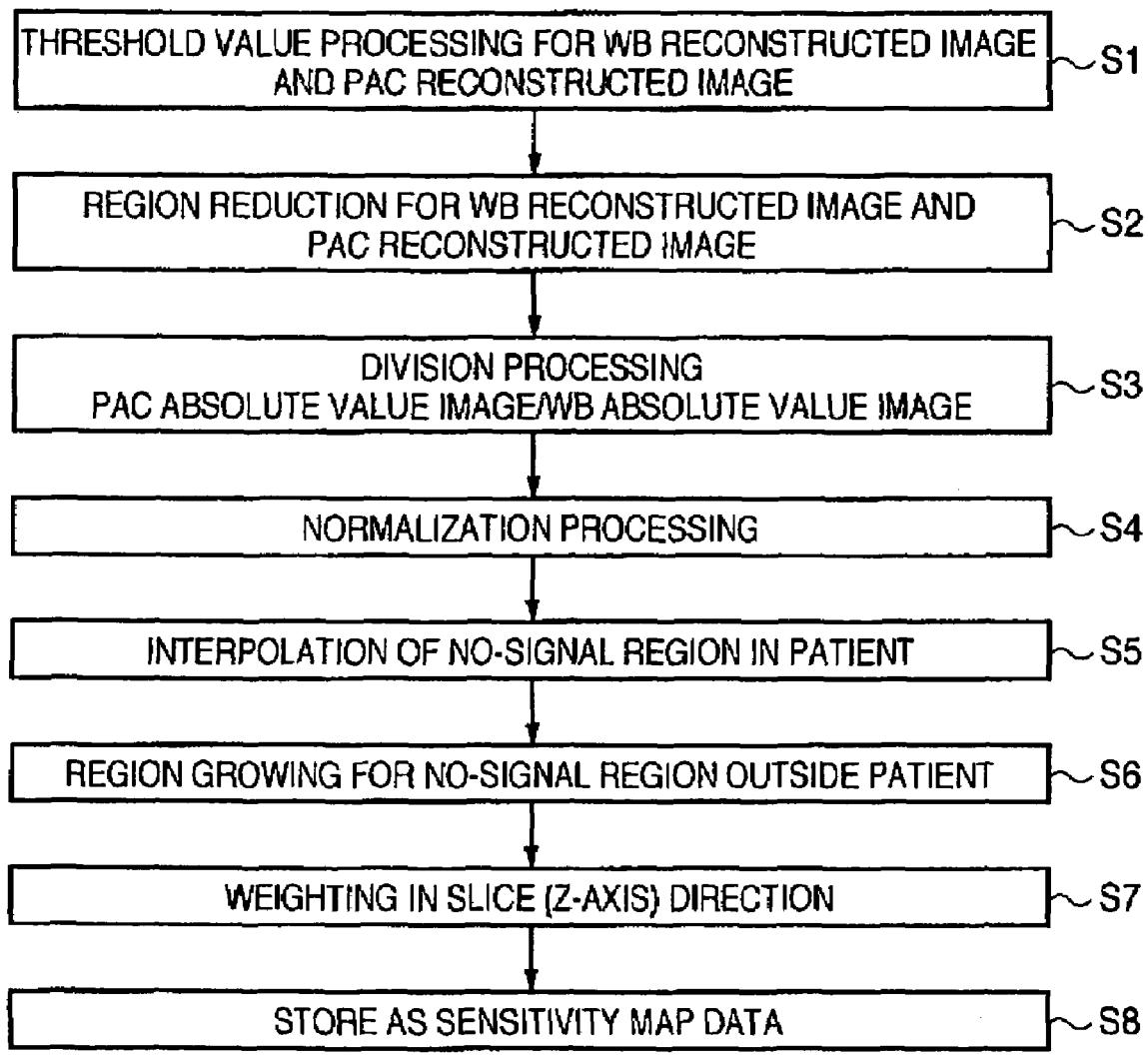
FIG. 25 is a flowchart showing a procedure to generate a sensitivity map by the conventional magnetic resonance imaging apparatus shown in FIG. 24.
Figure 26:
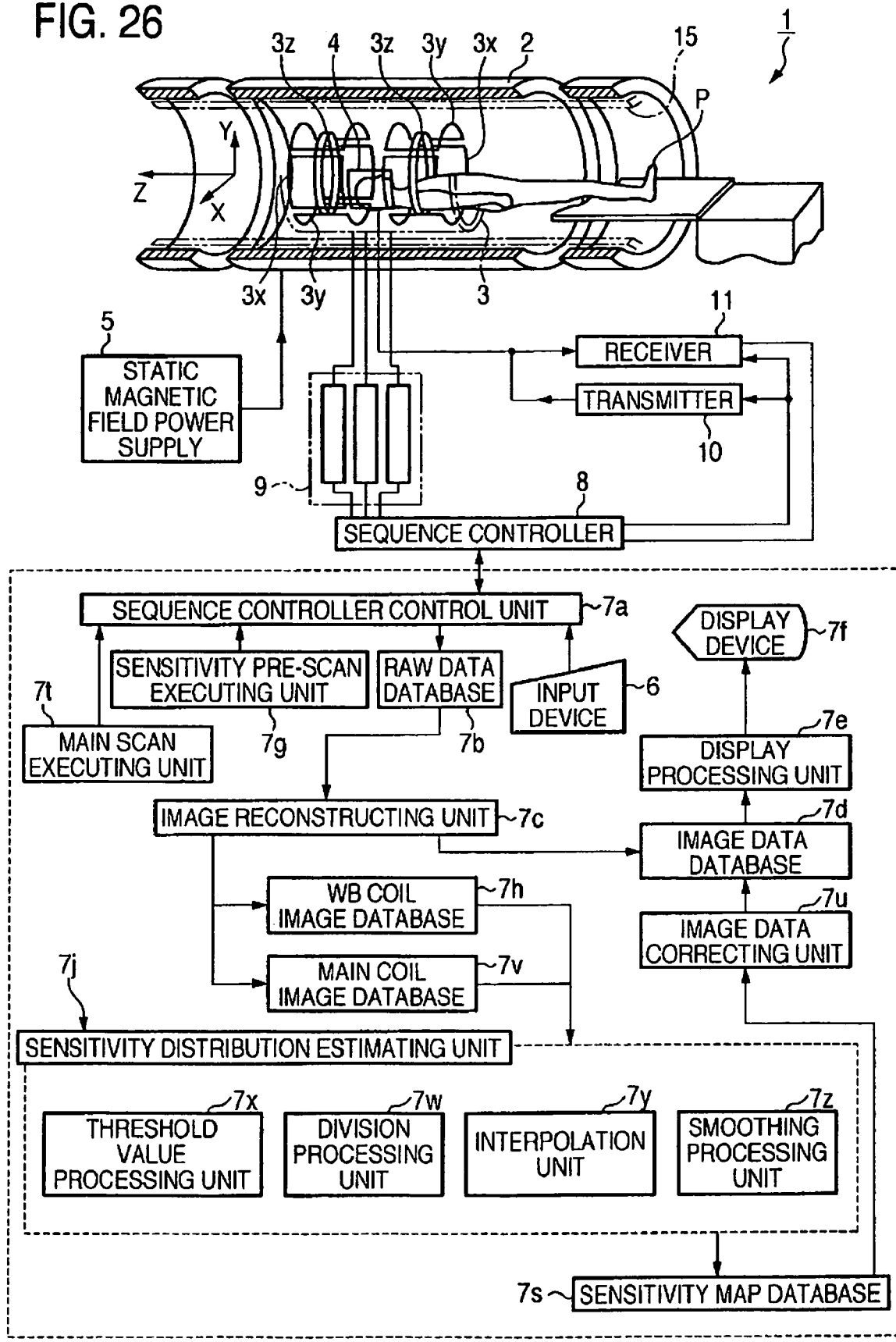
FIG. 26 is a functional block diagram of a conventional magnetic resonance imaging apparatus.
Figure 27:
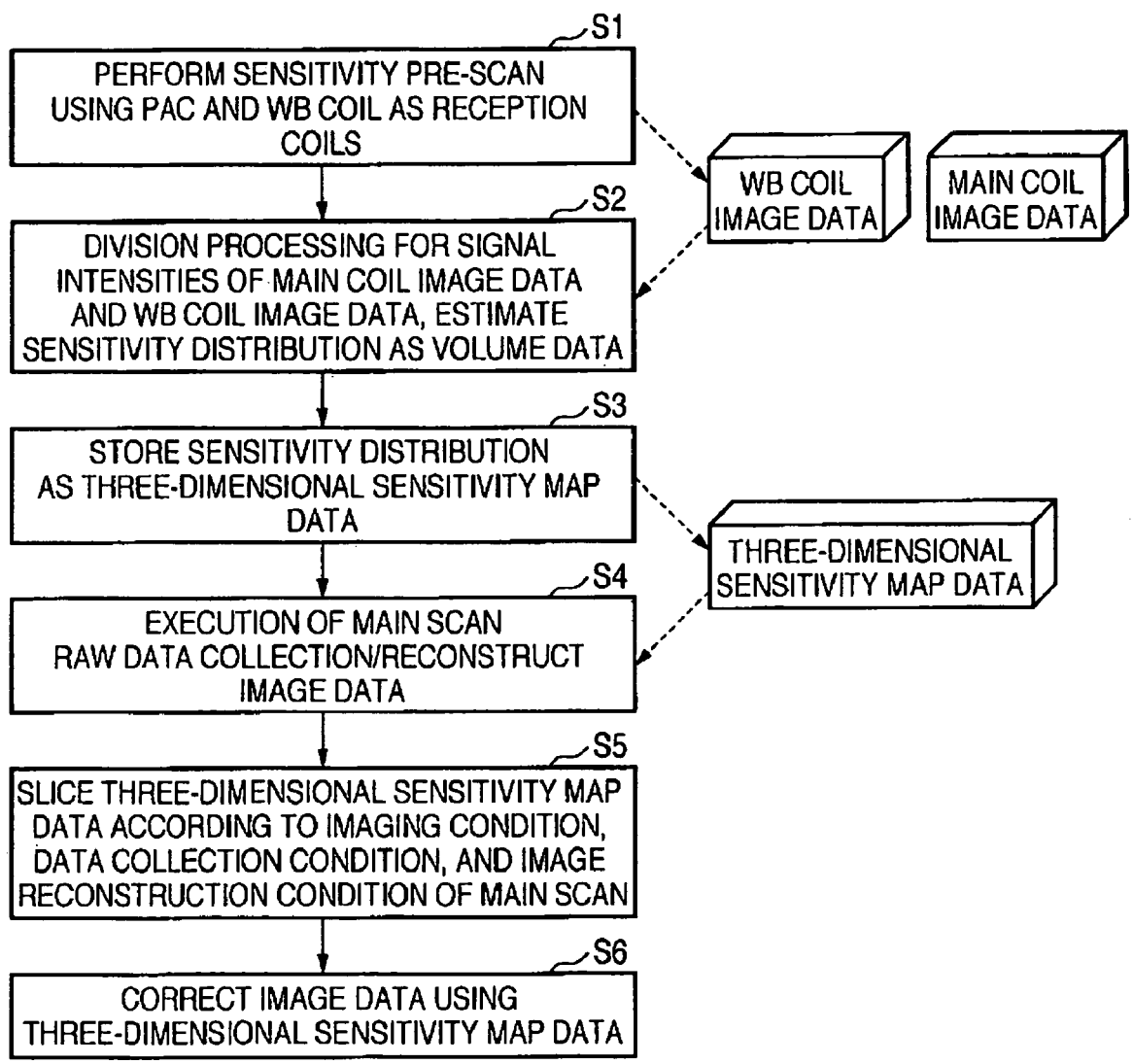
FIG. 27 is a flowchart showing a procedure for correcting signal intensity unevenness of image data by the conventional magnetic resonance imaging apparatus shown in FIG. 26.
Figures 28A, 28B, 28C, 28D:
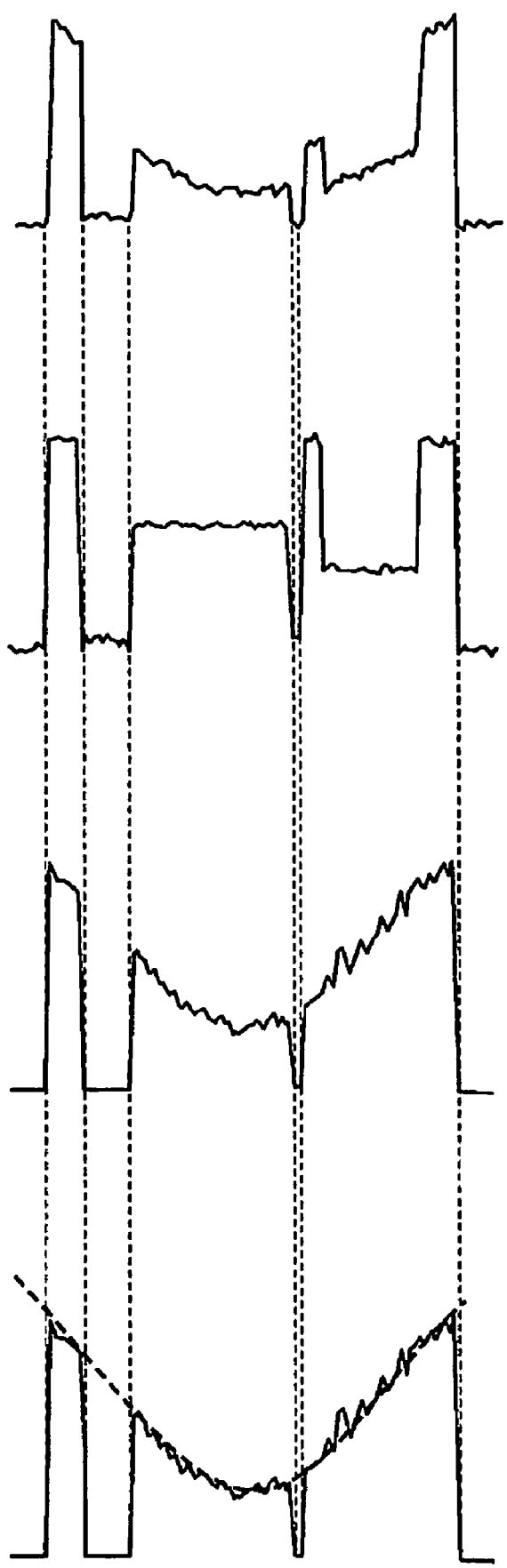
FIG. 28 is an explanatory diagram showing a procedure for estimating a sensitivity distribution by the conventional magnetic resonance imaging apparatus shown in FIG. 26.

FIG. 23 is a functional block diagram showing a third embodiment of the magnetic resonance imaging apparatus according to the invention.

A magnetic resonance imaging apparatus 20B shown in FIG. 23 is different from the magnetic resonance imaging apparatus 20A shown in FIG. 14 in that the computer 32 also functions as an imaging condition for shimming setting unit 60. Since the other components and actions are not substantially different from those of the magnetic resonance imaging apparatus 20A shown in FIG. 14, the identical components are denoted by the same reference numerals and signs and are not explained.

The computer 32 of the magnetic resonance imaging apparatus 20B also functions as the imaging condition for shimming setting unit 60. The imaging condition for shimming setting unit 60 has a function of setting an imaging condition in shimming, which is carried out to correct spatial non-uniformity of a static magnetic field, and gives the imaging condition to the sensitivity pre-scan executing unit 36. Therefore, the sensitivity pre-scan executing unit 36 is constituted to generate a sequence according to an imaging condition for carrying out sensitivity pre-scan and shimming simultaneously and give the sequence to the sequence controller control unit 38.

In the magnetic resonance imaging apparatus 20B, shimming is carried out together with execution of sensitivity pre-scan. As an imaging sequence in this case, for example, it is possible to set TE as two echoes of 4.5 ms/9.0 ms in the FFE and set a flip angle to about 5 to 10 degrees. It is possible to calculate a magnetic field distribution from a signal phase difference between the two echoes and use data of 4.6 ms for sensitivity data estimation.

Consequently, according to the magnetic resonance imaging apparatus 20B, in addition to the advantages of the magnetic resonance imaging apparatus 20A, it is possible to carry out more efficient imaging.

Note that, in the magnetic resonance imaging apparatuses 20A and 20B, it is possible to use not only the phased-array coil 24b but also various coils adapted to respective purposes such as a coil for head, various array coils, and a surface coil as the reception coil in the main scan, that is, the main coil of the RF coil 24. In addition, the RF coil 24 or the main coil may be constituted by a single coil.

Consequently, it is also possible to create sensitivity map data of the WB coil 24a using the WB coil 24a itself. Sensitivity unevenness of the WB coil 24a is smaller than that of the phased-array coil 24b. However, in future, if the apparatuses are reduced in size, it is highly likely that sensitivity unevenness cannot be neglected even in the WB coil 24a. Thus, if the WB coil 24a alone is used as the reception coil in the sensitivity pre-scan to create sensitivity map data of the WB coil 24a, it is possible to facilitate the reduction in size of the apparatuses.

On the other hand, if sensitivity map data is generated with only image data obtained by the reception coil in the main scan as original data, a coil other than the reception coil in the main scan may be used as a reception coil in the sensitivity pre-scan.

Moreover, the magnetic resonance imaging apparatuses 20, 20A, and 20B in the respective embodiments described above may be combined or a part of the components and the functions does not have to be provided.

The invention claimed is:

1. A magnetic resonance imaging apparatus comprising:
   a scan executing unit that executes scan to generate sensitivity map data of an RF coil;
   a region reduction unit that applies region reduction to a signal region near a no-signal region of image data obtained by the scan;
   a sensitivity map data generating unit that generates sensitivity map data using the image data after the region reduction; and
   a smoothing processing unit that applies three-dimensional smoothing filter to the sensitivity map data.

2. A magnetic resonance imaging apparatus comprising:
   a scan executing unit that executes scan to generate sensitivity map data of an RF coil;
   a sensitivity map data generating unit that generates sensitivity map data using image data obtained by the scan;
   a linear interpolation unit that linearly interpolates a no-signal region in a patient of the sensitivity map data; and
   a smoothing processing unit that applies three-dimensional smoothing filter to the sensitivity map data.

3. A magnetic resonance imaging apparatus comprising:
   a scan executing unit that executes scan to generate sensitivity correction data for a reception coil in imaging using the reception coil in the imaging as a reception coil; and
   a sensitivity correction data generating unit that generates the sensitivity correction data using only data acquired by the reception coil in the imaging in the scan as original data after region reduction processing of data extracted by applying threshold value processing to original data of the sensitivity correction data.

4. A magnetic resonance imaging apparatus according to claim 1, further comprising a region growing unit that subjects a no-signal region outside a patient of the sensitivity map data to region growing.

5. A magnetic resonance imaging apparatus according to claim 1, further comprising a slice direction weighting unit that weights the sensitivity map data in a slice direction to thereby correct the sensitivity map data.

6. A magnetic resonance imaging apparatus according to claim 2, further comprising a region growing unit that subjects a no-signal region outside a patient of the sensitivity map data to region growing.

7. A magnetic resonance imaging apparatus according to claim 2, further comprising a slice direction weighting unit that weights the sensitivity map data in a slice direction to thereby correct the sensitivity map data.

8. A magnetic resonance imaging apparatus according to claim 2, further comprising a data smoothing unit that performs data smoothing processing to transform the sensitivity map data into a smoothed distribution suitable for linear interpolation using an arbitrary transform function and, on the other hand, bringing the sensitivity map data after linear interpolation processing back to a distribution before the data smoothing processing, using an inverse transform function wherein
   the linear interpolation unit linearly interpolates a no-signal region of the sensitivity map data after the data smoothing processing and, on the other hand, the smoothing processing unit applies three-dimensional smoothing filter to the sensitivity map data that is brought back to the distribution before the data smoothing processing by the data smoothing unit.

9. A magnetic resonance imaging apparatus according to claim 3, wherein an imaging condition in the scan to generate the sensitivity correction data are conditions to obtain an image of a contrast sufficiently low to use only the data acquired by the reception coil in the imaging as original data of the sensitivity correction data.

10. A magnetic resonance imaging apparatus according to claim 3, wherein the scan executing unit executes the scan to generate the sensitivity correction data using a surface coil as the reception coil.

11. A data processing method for a magnetic resonance imaging apparatus comprising:
    a step of applying region reduction to a signal region near a no-signal region of image data obtained by scan to generate sensitivity map data of an RF coil;
    a step of generating sensitivity map data using the image data after the region reduction; and
    a step of applying three-dimensional smoothing filter to the sensitivity map data.

12. A data processing method for a magnetic resonance imaging apparatus according to the invention comprising:
    a step of generating sensitivity map data using image data obtained by scan to generate sensitivity map data of an RF coil;
    a step of linearly interpolating a no-signal region in a patient of the sensitivity map data; and
    a step of applying three-dimensional smoothing filter to the sensitivity map data.

13. A data processing method for a magnetic resonance imaging apparatus comprising:
    executing scan to generate sensitivity correction data for a reception coil in imaging using the reception coil in the imaging as a reception coil; and
    generating the sensitivity correction data using only data acquired by the reception coil in the imaging in the scan as original data after region reduction processing of data extracted by applying threshold value processing to original data of the sensitivity correction data.

* * * * *